(12) United States Patent
Ito et al.

(10) Patent No.: US 11,397,446 B2
(45) Date of Patent: Jul. 26, 2022

(54) CIRCUIT DEVICE, ELECTRONIC DEVICE, COMMUNICATION SYSTEM, AND VEHICLE ELECTRONIC KEY SYSTEM

(71) Applicant: Seiko Epson Corporation, Toyko (JP)

(72) Inventors: Hisahiro Ito, Suwa (JP); Hideo Haneda, Matsumoto (JP); Yasuhiro Sudo, Chino (JP); Akio Tsutsumi, Chino (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/126,521

(22) Filed: Dec. 18, 2020

(65) Prior Publication Data

US 2022/0004220 A1    Jan. 6, 2022

(30) Foreign Application Priority Data

Dec. 20, 2019 (JP) .............................. JP2019-229912

(51) Int. Cl.
| | |
|---|---|
| *G06F 1/10* | (2006.01) |
| *G04F 10/00* | (2006.01) |
| *H04B 1/38* | (2015.01) |
| *E05B 81/54* | (2014.01) |
| *H03F 3/24* | (2006.01) |

(52) U.S. Cl.
CPC ................ *G06F 1/10* (2013.01); *E05B 81/54* (2013.01); *G04F 10/005* (2013.01); *H03F 3/245* (2013.01); *H04B 1/38* (2013.01); *H03F 2200/451* (2013.01)

(58) Field of Classification Search
CPC ........ G06F 1/10; E05B 81/54; G04F 10/0005; H03F 3/245; H03F 2200/451; H04B 1/38
See application file for complete search history.

(56) References Cited

U.S. PATENT DOCUMENTS

| | | | |
|---|---|---|---|
| 2017/0096124 A1* | 4/2017 | Watanabe | ............... G08C 17/02 |
| 2017/0342750 A1 | 11/2017 | Hiramine | |
| 2018/0088536 A1* | 3/2018 | Kurashina | ................ H03L 7/181 |
| 2018/0144570 A1* | 5/2018 | Oomi | ..................... B60W 40/02 |
| 2019/0092278 A1* | 3/2019 | Okada | ..................... B60R 25/04 |
| 2020/0020184 A1* | 1/2020 | Noll | .................... G07C 9/00309 |
| 2020/0137684 A1* | 4/2020 | Mattela | ............. H04L 25/03828 |

FOREIGN PATENT DOCUMENTS

| | | |
|---|---|---|
| JP | 2017-210800 A | 11/2017 |
| JP | 2019-065610 A | 4/2019 |

* cited by examiner

*Primary Examiner* — Dac V Ha
(74) *Attorney, Agent, or Firm* — Harness, Dickey & Pierce, P.L.C.

(57) ABSTRACT

A circuit device is used in an electronic device including a receiver, a control circuit that performs processing on reception data received by the receiver using a clock signal, a transmitter that transmits transmission data generated by performing processing based on the reception data by the control circuit. The circuit device includes a time-to-digital conversion circuit that measures a time difference between a transition timing of a start signal based on the reception data and a transition timing of a stop signal based on the transmission data or the clock signal, and an output interface that outputs, to the control circuit, a measurement result of the time difference of the time-to-digital conversion circuit.

15 Claims, 12 Drawing Sheets

CIRCUIT DEVICE, ELECTRONIC DEVICE, COMMUNICATION SYSTEM, AND VEHICLE ELECTRONIC KEY SYSTEM

The present application is based on, and claims priority from JP Application Serial Number 2019-229912, filed Dec. 20, 2019, the disclosure of which is hereby incorporated by reference herein in its entirety.

BACKGROUND

1. Technical Field

The present disclosure relates to a circuit device, an electronic device, a communication system, and a vehicle electronic key system.

2. Related Art

In a communication system including a host device and an electronic device which is a terminal device and performing communication between the host device and the electronic device, separate clock signals are used for the electronic device and the host device. As a result, the clock signals used in the electronic device and the host device are asynchronous with each other, which causes various problems.

For example, JP-A-2019-65610 discloses a vehicle electronic key system which is a communication system in which an in-vehicle device is provided as a host device and a portable device is provided as an electronic device. The electronic key system detects that a relay attack has been received. In the electronic key system, the in-vehicle device measures, as a signal round-trip time, a time to receive a response signal from the portable device after transmitting a challenge signal to the portable device which is a vehicle electronic key, and measures, as a response processing time, a time required to return the response signal to the portable device after receiving the challenge signal from the portable device. When a determination time obtained by subtracting the response processing time from the signal round-trip time does not fall within an appropriate range set in advance, the electronic key system determines that the relay attack is received.

In the electronic key system of JP-A-2019-65610, the response processing time is measured by counting processing based on a clock signal generated by a clock oscillator built in the portable device. However, the clock signal of the clock oscillator is not synchronized with the clock signal of the in-vehicle device, and thus an error at most one clock may occur before the counting processing is started. This error becomes an error of the determination time, which may deteriorate accuracy in determination whether or not the relay attack is received. As such, in the communication system that communicates between the electronic device and the host device, various problems may occur due to the fact that the clock signal of the electronic device and the clock signal of the host device are asynchronous with each other.

SUMMARY

An aspect of the present disclosure relates to a circuit device that is used in an electronic device including a receiver, a control circuit that performs processing on reception data received by the receiver using a clock signal, a transmitter that transmits transmission data generated by performing processing on the reception data by the control circuit. The circuit device includes: a time-to-digital conversion circuit that measures a time difference between a transition timing of a start signal based on the reception data and a transition timing of a stop signal based on the transmission data or the clock signal; and an output interface that outputs, to the control circuit, a measurement result of the time difference of the time-to-digital conversion circuit.

DESCRIPTION OF EXEMPLARY EMBODIMENTS

The present embodiment will be described below. The present embodiment to be described below does not unduly limit contents described in the appended claims. In addition, all of configurations described in the present embodiment are not essential configuration requirements.

1. Circuit Device, electronic device, and Communication System

Figure 1:
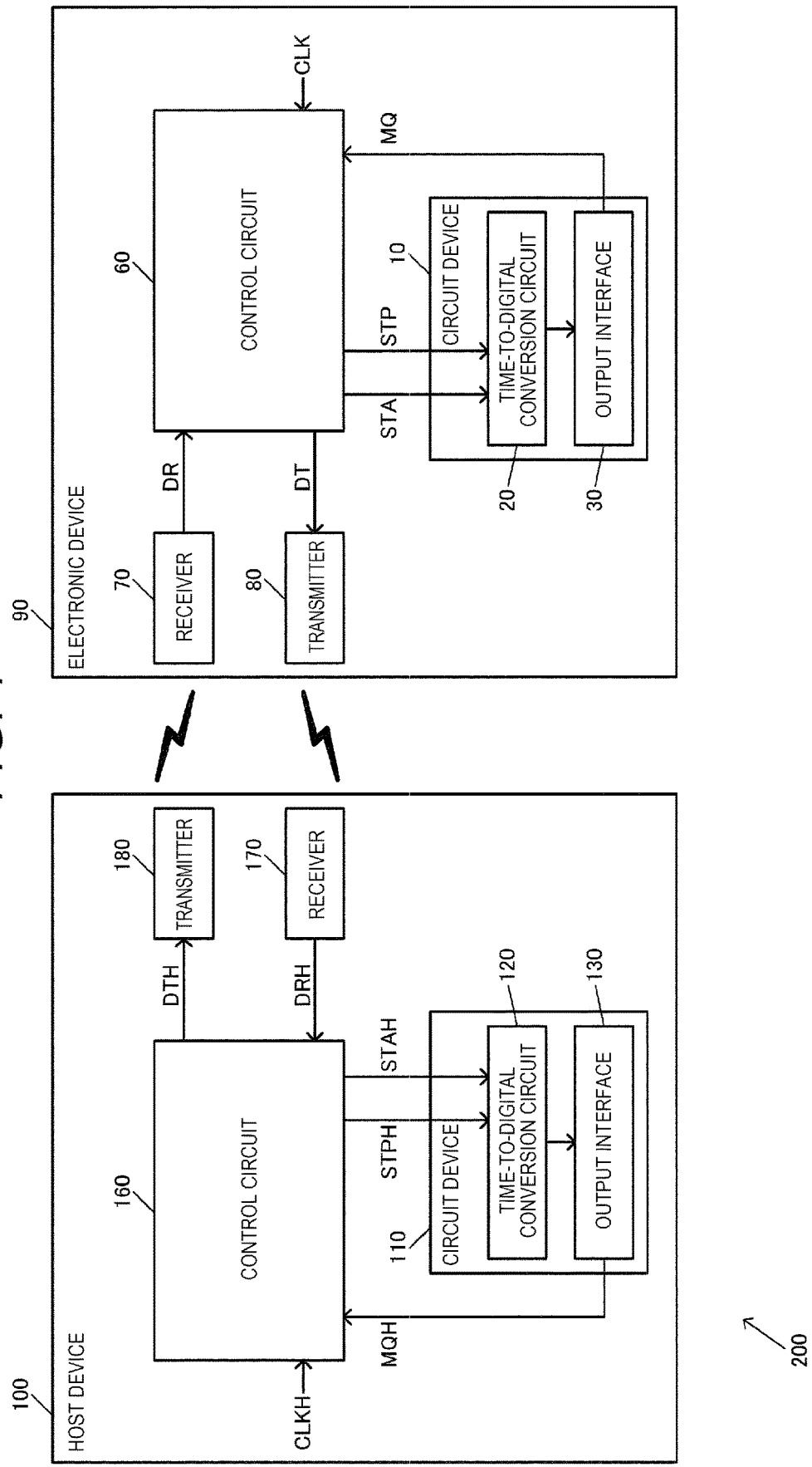
FIG. 1 illustrates a configuration example of a circuit device, an electronic device, and a communication system of the present embodiment.

FIG. 1 illustrates a configuration example of a circuit device 10, an electronic device 90, and a communication system 200 of the present embodiment. The communication system 200 of the present embodiment includes the electronic device 90 of the present embodiment, and a host device 100. The electronic device 90 is a terminal device that is coupled to communicate with the host device 100, for example. The host device 100 transmits reception data DR received by the electronic device 90 to the electronic device 90, and receives, from the electronic device 90, transmission data DT from the electronic device 90. The electronic device 90 and the host device 100 communicate data by wireless communication, for example. The electronic device 90 and the host device 100 may communicate data by wired communication.

The electronic device 90 includes a receiver 70, a transmitter 80, a control circuit 60, and a circuit device 10. The receiver 70 receives the reception data DR. Specifically, transmission data DTH transmitted by the host device 100 is received as the reception data DR. The control circuit 60 performs processing on the reception data DR received by the receiver 70 using a clock signal CLK. For example, the control circuit 60 operates according to the clock signal CLK to perform processing, such as encryption processing to be described below, on the reception data DR and output the transmission data DT generated by the processing to the transmitter 80. The control circuit 60 can be implemented by, for example, a processor such as a microcomputer, or can be implemented by an application specific integrated circuit (ASIC). The transmitter 80 transmits the transmission data DT generated by performing the processing based on the reception data DR by the control circuit 60. That is, the transmission data DT is transmitted to the host device 100 by wireless communication or the like. The receiver 70 and the transmitter 80 can be implemented by, for example, an ASIC for communication or a processor for communication.

The host device 100 includes a receiver 170, a transmitter 180, a control circuit 160, and a circuit device 110. The transmitter 180 transmits the transmission data DTH. Specifically, the transmission data DTH generated by the control circuit 160 is transmitted to the electronic device 90. The receiver 170 receives reception data DRH. Specifically, the transmission data DT transmitted by the electronic device 90 is received as the reception data DRH. The control circuit 160 performs processing on the reception data DRH using a clock signal CLKH. For example, the control circuit 160 performs, based on the reception data DRH, decryption processing to be described below, or processing for distance measurement. The control circuit 60 can be implemented by, for example, a processor such as a microcomputer, or can be implemented by an ASIC. The receiver 170 and the transmitter 180 can be implemented by an ASIC for communication or a processor for communication. The circuit device 110 includes a time-to-digital conversion circuit 120 and an output interface 130. The time-to-digital conversion circuit 120 measures a time difference between a transition timing of a start signal STAH based on the transmission data DTH and a transition timing of a stop signal STPH based on the reception data DRH, for example. The output interface 130 outputs a measurement result MQH of the time difference to the control circuit 160.

When the communication system 200 of the present embodiment is a vehicle electronic key system, the host device 100 is an in-vehicle device, the electronic device 90 is a vehicle electronic key, and a portable device of the electronic key. The vehicle electronic key is also referred to as a smart key. For example, a challenge response method is used as an authentication method between the in-vehicle device and the vehicle electronic key. Specifically, the transmitter 180 of the in-vehicle device, which is the host device 100, transmits a challenge signal including a challenge code as a polling signal, and the receiver 70 of the vehicle electronic key, which is the electronic device 90, receives the challenge signal. The vehicle electronic key performs the encryption processing with a common encryption key on the challenge code included in the challenge signal, and transmits a response signal including a response code obtained by the encryption processing to the in-vehicle device. In addition, the in-vehicle device decrypts the response code of the received response signal using the common encryption key and determines whether the response code and the challenge code match with each other, thereby realizing authentication of the vehicle electronic key. As described above, the vehicle electronic key is authenticated by the wireless communication, such that it is possible to realize a system in which a user carrying the vehicle electronic key can unlock and lock a door without operating the vehicle electronic key as a key, that is, a smart entry system.

In this case, the transmitter 180 of the in-vehicle device and the receiver 70 of the vehicle electronic key perform wireless communication in low frequency (LF) bandwidth. The LF bandwidth is, for example, a bandwidth of 30 kHz to 300 kHz. In the electronic key system, a frequency of 125 kHz or 134 kHz is used as a communication frequency of the LF. The communication is performed in the LF bandwidth as described above, such that it is possible to set a range within 5 meters from a vehicle as a vehicle communication area, for example. On the other hand, the transmitter 80 of the vehicle electronic key and the receiver 170 of the in-vehicle device perform wireless communication in an ultra high frequency (UHF) bandwidth. The UHF bandwidth is, for example, a bandwidth of 300 MHz to 3 GHz. In the electronic key system, a frequency of 315 MHz is used as a communication frequency of the UHF.

In the communication system 200 as illustrated in FIG. 1, the circuit device 10 of the present embodiment used in the electronic device 90 includes a time-to-digital conversion circuit 20 and an output interface 30. The circuit device 10 of the present embodiment may be used in the electronic device 90 as illustrated in FIG. 1, and the circuit device 10 may be provided in the transmitter 80, for example, as described below.

The time-to-digital conversion circuit 20 measures a time difference between a transition timing of a start signal STA based on the reception data DR and a transition timing of a stop signal STP based on the transmission data DT or the clock signal CLK. For example, the time-to-digital conversion circuit 20 obtains and outputs a digital value corresponding to the time difference between the transition timings of the start signal STA and the stop signal STP. The output interface 30 outputs a measurement result MQ of the time difference of the time-to-digital conversion circuit 20 to the control circuit 60. For example, the output interface 30 is a circuit including a buffer circuit that outputs a signal of the measurement result MQ. For example, the output interface 30 can be implemented by a serial interface circuit such as a serial peripheral interface (SPI) or an inter-integrated circuit (I2C). For example, when the control circuit 60 is a microcomputer, communication between the circuit device 10 and the control circuit 60 is performed using the serial interface circuit such as an SPI or an I2C. Thus, data of the measurement result MQ can be transmitted to the control circuit 60.

The start signal STA and the stop signal STP are, for example, pulse signals, and the transition timings of the start signal STA and the stop signal STP are, for example, a timing of a rising edge of the pulse signal. The transition timings may be a timing of falling edge of the pulse signal.

The time-to-digital conversion circuit 20 measures a time difference between a transition timing of the start signal STA based on the reception data DR and a transition timing of the stop signal STP based on the transmission data DT, for example. In this case, the transition timing of the start signal STA based on the reception data DR is, for example, a timing when the reception of the reception data DR is completed. For example, the reception data DR received by the receiver 70 is output to the control circuit 60. However, the transition timing of the start signal STA based on the reception data DR is a timing of a tail end of the reception data DR output from the receiver 70 to the control circuit 60. Further, the control circuit 60 generates the transmission data DT by performing the processing on the reception data DR and outputs the generated transmission data DT to the transmitter 80. However, the transition timing of the stop signal STP based on the transmission data DT is, for example, a timing when the processing of the control circuit 60 is completed. For example, the transition timing of the stop signal STP based on the transmission data DT is a timing when the control circuit 60 completes the processing and outputs the transmission data DT to the transmitter 80.

Further, the time-to-digital conversion circuit 20 may measure a time difference between the transition timing of the start signal STA based on the reception data DR and the transition timing of the stop signal STP based on the clock signal CLK, for example. In this case, the transition timing of the start signal STA based on the reception data DR is, for example, a timing when the reception of the reception data DR is completed, as described above. For example, the transition timing of the start signal STA based on the reception data DR is the timing of the tail end of the reception data DR. On the other hand, the transition timing of the stop signal STP based on the clock signal CLK is, for example, the transition timing of the clock signal CLK after the transition timing of the start signal STA. For example, the transition timing of the stop signal STP based on the clock signal CLK is a timing of a rising edge of the clock signal CLK or a timing of a falling edge of the clock signal CLK after a signal level of the start signal STA is transitioned and becomes active.

The output interface 30 outputs, to the control circuit 60, the measurement result MQ corresponding to the time difference between the transition timings of the start signal STA and the stop signal STP measured by the time-to-digital conversion circuit 20. For example, the control circuit 60 performs digital data processing, such as encryption processing, on the reception data DR of the receiver 70 using the clock signal CLK. For example, the control circuit 60 obtains a processing time from the reception of the reception data DR to the completion of the processing based on the measurement result MQ corresponding to the time difference between the transition timings of the start signal STA and the stop signal STP. As described above, the processing time of the control circuit 60 is obtained based on the measurement result MQ of the time-to-digital conversion circuit 20, such that even when the clock signal CLK on the electronic device 90 side and the clock signal CLKH on the host device 100 side are asynchronous, the processing time can be accurately obtained. In addition, the control circuit 60 outputs the transmission data DT including the processing time information to the transmitter 80, and the transmitter 80 transmits the transmission data DT to the host device 100. As a result, even when the clock signals CLK and CLKH are asynchronous, the accurate measurement result of the processing time of the control circuit 60 can be transmitted to the host device 100.

Alternatively, the time-to-digital conversion circuit 20 measures a time difference between the transition timing of the start signal STA based on the reception data DR and the transition timing of the stop signal STP based on the clock signal CLK. Accordingly, information on a synchronization error between the clock signal CLK and the clock signal CLKH which are asynchronous is output to the control circuit 60 as the measurement result MQ. The information on the synchronization error is information indicating a phase difference between the clock signal CLK and the clock signal CLKH. The control circuit 60 outputs, to the transmitter 80, the transmission data DT including the information on the synchronization error and information on a count value obtained by counting the processing time of the control circuit 60 with the clock signal CLK, and the transmitter 80 transmits the transmission data DT to the host device 100. As such, by transmitting, to the host device 100, the count value obtained by counting the processing time with the clock signal CLK and the information on the synchronization error between the clock signals CLK and CLKH, even when the clock signals CLK and CLKH are asynchronous, it is possible to transmit the accurate measurement result of the processing time of the control circuit 60 to the host device 100.

The circuit device 110 of the host device 100 includes the time-to-digital conversion circuit 120 and the output interface 130. The time-to-digital conversion circuit 120 measures a time difference between a transition timing of a start signal STAH based on the transmission data DTH and a transition timing of a stop signal STPH based on the reception data DRH, for example. For example, the transition timing of the start signal STAH based on the transmission data DTH is a timing when the transmission of the transmission data DTH is completed, and the transition timing of the stop signal STPH based on the reception data DRH is a timing when the reception of the reception data DRH is completed. In this case, the time-to-digital conversion circuit 120 measures a time difference between the timing when the transmission of the transmission data DTH is completed and the timing when the reception of the reception data DRH is completed. The output interface 130 outputs a measurement result MQH of the time difference of the time-to-digital conversion circuit 120 to the control circuit 160. Thus, the control circuit 160 can measure a time required to receive the reception data DRH after transmitting the transmission data DTH. As described above, the host device 100 receives the measurement result of the processing time of the processing performed by the control circuit 60 of the electronic device 90. Accordingly, it is possible to obtain a radio wave propagation time in a wireless communication between the host device 100 and the electronic device 90 based on the time required to receive the reception data DRH after transmitting the transmission data DTH and the processing time of the control circuit 60. For example, a distance between the host device 100 and the electronic device 90 can be measured based on the radio wave propagation time. Thus, for example, when the communication system 200 in FIG. 1 is a vehicle electronic key system, the relay attack in the smart entry system can be prevented by using the measured distance. For example, when the measured distance is longer than the expected distance in the smart entry system, it can be determined that the relay attack is carried out.

With the circuit device 10 of the present embodiment as described above, The time-to-digital conversion circuit 20 measures a time difference between the transition timing of the start signal STA based on the reception data DR and a transition timing of the stop signal STP based on the transmission data DT or the clock signal CLK, and the measurement result MQ is output to the control circuit 60. With this configuration, even when the clock signal CLK on the electronic device 90 side and the clock signal CLKH on the host device 100 side are asynchronous, it is possible to obtain the accurate measurement result of the processing time of the control circuit 60 or the information on the synchronization error between the clock signals CLK and CLKH by using the time-to-digital conversion circuit 20. Therefore, it is possible to solve a problem that occurs due to the asynchronous clock signals CLK and CLKH.

Figure 2:
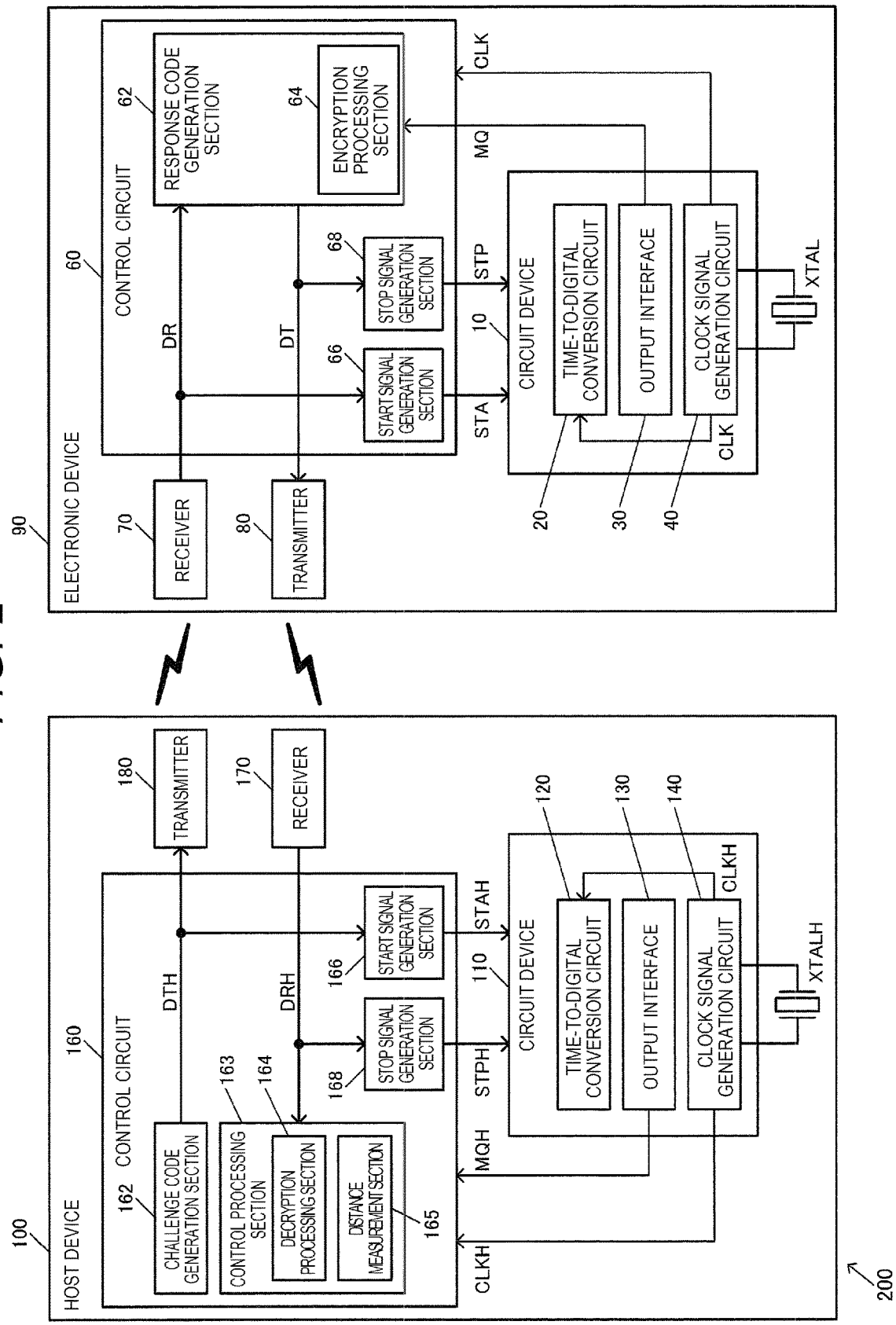
FIG. 2 illustrates a detailed configuration example of the circuit device, the electronic device, and the communication system of the present embodiment.

FIG. 2 illustrates a detailed configuration example of the circuit device 10, the electronic device 90, and the communication system 200 of the present embodiment. In FIG. 2, the circuit device 10 includes a clock signal generation circuit 40. The clock signal generation circuit 40 generates the clock signal CLK using a resonator XTAL to output the generated clock signal CLK to the control circuit 60. The control circuit 60 operates the clock signal CLK as an operation clock signal. Specifically, the clock signal generation circuit 40 is constituted by an oscillation circuit that oscillates the resonator XTAL. This oscillation circuit includes a drive circuit for oscillation to which the resonator XTAL is coupled and which is provided between a first resonator terminal and a second resonator terminal. For example, the oscillation circuit can be implemented by a transistor such as a bipolar transistor that realizes a drive circuit, and an active element such as a capacitor or a resistor. For example, as the oscillation circuit, various types of oscillation circuits such as a Pierce type, a Colpitts type, an inverter type, and a Hartley type can be used.

The resonator XTAL is an element that generates mechanical vibration by an electric signal. The resonator XTAL can be implemented by, for example, a resonator element such as a crystal resonator element. For example, the resonator XTAL can be implemented by a crystal resonator element having a cut angle of AT cut or SC cut and exciting thickness-shear vibration. The resonator XTAL of the present embodiment can be implemented by, for example, various resonator elements such as a resonator element other than a thickness-shear vibration-type resonator or a piezoelectric resonator element formed of a material other than a quartz crystal. For example, as the resonator XTAL, a surface acoustic wave (SAW) resonator, a micro electro mechanical systems (MEMS) resonator as a silicon resonator formed using a silicon substrate, or the like may be adopted.

The control circuit 60 is operated by using the clock signal CLK generated by the clock signal generation circuit 40 provided in the circuit device 10 as described above, and thus, a separate clock signal generation circuit does not need to be provided in the control circuit 60. As a result, the electronic device 90 can be reduced in size or cost. Further, the clock signal CLK is generated using the resonator XTAL implemented by a crystal resonator element or the like, and thus has high frequency accuracy. For example, the clock signal CLK having frequency accuracy of ±50 ppm or less can be generated. Then, when the processing time of the control circuit 60 that performs the processing using the clock signal CLK having such high frequency accuracy is measured using the count value of the clock signal CLK, measurement accuracy of the processing time can also be improved.

Therefore, when the host device 100 measures the radio wave propagation time or the distance between the electronic device 90 and the host device 100, for example, based on measurement information on the processing time, the accuracy of the measurement result can be improved.

Further, the time-to-digital conversion circuit 20 measures a time difference between the transition timings of the start signal STA and the stop signal STP using the clock signal CLK generated by the clock signal generation circuit 40. Specifically, the time difference is measured by the time-to-digital conversion circuit 20 having a configuration to be described below with reference to FIGS. 8 to 11. The clock signal CLK is generated using such a resonator XTAL implemented by a crystal resonator element or the like, such that the clock signal CLK having a highly accurate clock frequency can be obtained. The time-to-digital conversion circuit 20 performs time-to-digital conversion using the clock signal CLK having high frequency accuracy, thereby improving accuracy of the time-to-digital conversion, as compared with a case where the time-to-digital conversion is implemented using a semiconductor element. Accordingly, when the time-to-digital conversion circuit 20 measures the time difference between the transition timing of the start signal STA based on the reception data DR and the transition timing of the stop signal STP based on the transmission data DT or the clock signal CLK, the time-to-digital conversion circuit 20 can measure the time difference with high accuracy and can output, to the control circuit 60, the measurement result MQ with high accuracy. Therefore, when the processing time of the processing performed by the control circuit 60 is measured based on the measurement result MQ of the time-to-digital conversion circuit 20, the accuracy of measuring the processing time can be improved. Further, when the time-to-digital conversion circuit 20 measures the time difference between the transition timing of the start signal STA based on the reception data DR and the transition timing of the stop signal STP based on the clock signal CLK, it is possible to measure the synchronization error between the clock signals CLK and CLKH that are asynchronous with high accuracy.

The control circuit 60 also includes a start signal generation section 66 and a stop signal generation section 68. The start signal generation section 66 generates the start signal STA based on the reception data DR. For example, the start signal generation section 66 generates the start signal STA whose signal level is transitioned at the timing when the reception of the reception data DR is completed. Specifically, the start signal STA that generates a pulse is generated at the timing when the reception of the reception data DR is completed.

The stop signal generation section 68 generates the stop signal STP based on the transmission data DT. For example, the stop signal generation section 68 generates the stop signal STP whose signal level is transitioned at the timing when the control circuit 60 completes the processing such as the encryption processing and outputs the transmission data DT to the transmitter 80. Specifically, the stop signal STP that generates a pulse is generated at the timing when the control circuit 60 completes the processing and outputs the transmission data DT. Alternatively, the stop signal generation section 68 may generate the stop signal STP based on the clock signal CLK. For example, the stop signal generation section 68 generates the stop signal STP whose signal level is transitioned at the timing of a rising edge of the clock signal CLK or the like, after the signal level of the start signal STA is transitioned.

Further, in FIG. 2, the control circuit 160 of the host device 100 also includes a start signal generation section 166 and a stop signal generation section 168. The start signal generation section 166 generates the start signal STAH based on the transmission data DTH. For example, the start signal generation section 166 generates the start signal STAH whose signal level is transitioned at the timing when the transmission of the transmission data DTH is completed. The stop signal generation section 168 generates the stop signal STPH based on the reception data DRH. For example, the stop signal generation section 168 generates the stop signal STPH whose signal level is transitioned at the timing when the reception of the reception data DRH is completed.

The control circuit 60 of the electronic device 90 also includes a response code generation section 62, and a response code generation section 62 includes an encryption processing section 64. The control circuit 160 of the host device 100 also includes a challenge code generation section 162 and a control processing section 163, and the control processing section 163 includes a decryption processing section 164 and a distance measurement section 165. For example, in the authentication of the challenge response method described above, the challenge code generation section 162 of the host device 100 generates a challenge code. The challenge code is a code for authenticating the electronic device 90, and is generated using, for example, a random number. Then, the transmitter 180 transmits the transmission data DTH including the generated challenge code to the electronic device 90. The receiver 70 of the electronic device 90 receives the transmission data DTH as the reception data DR. Then, the response code generation section 62 generates a response code based on the challenge code included in the reception data DR. Specifically, the encryption processing section 64 of the response code generation section 62 generates a response code by performing the encryption processing on the challenge code using a common key registered in advance. As an encryption method, a method such as advanced encryption standard (AES), data encryption standard (DES), or RC4 can be adopted. The transmitter 80 transmits the transmission data DT including the response code to the host device 100. In this case, the transmission data DT can include the measurement result of the processing time as described above. Alternatively, the transmission data DT can include the information on the synchronization error and the information on the count value of the counting processing based on the clock signal CLK. The receiver 170 of the host device 100 receives the transmission data DT as the reception data DRH. Then, the decryption processing section 164 of the control processing section 163 performs the decryption processing on the response code included in the reception data DRH using the common key registered in advance. After the decryption processing, determination is performed whether or not the response code and the challenge code match with each other. When the response code and the challenge code match with each other, the electronic device 90 is authenticated as a proper device. Further, the distance measurement section 165 obtains the radio wave propagation time based on the information on the processing time included in the reception data DRH, and measures the distance between the electronic device 90 and the host device 100. Alternatively, the distance measurement section 165 obtains the radio wave propagation time based on the information on the synchronization error and the information on the count value included in the reception data DRH, and measures the distance between the electronic device 90 and the host device 100.

Figure 3:
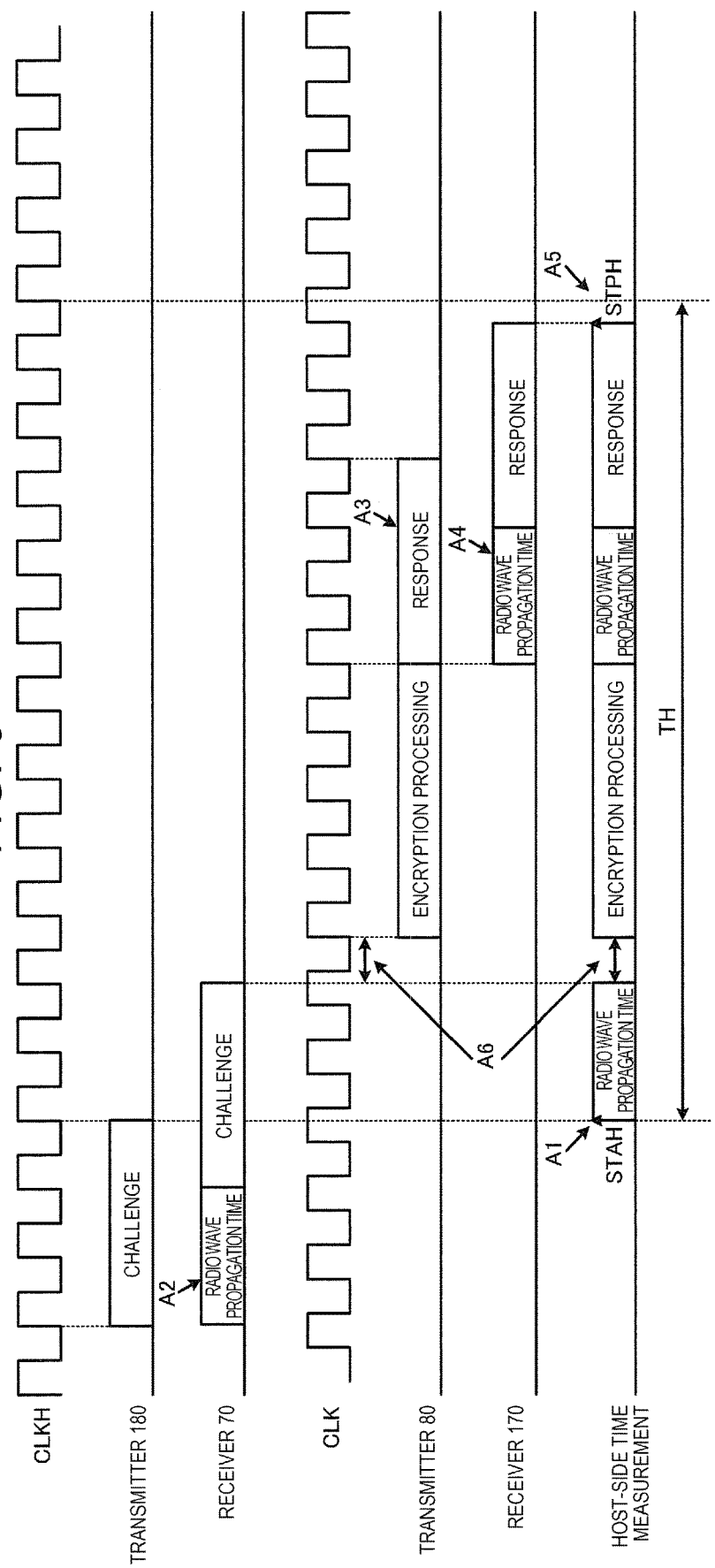
FIG. 3 is a signal waveform diagram illustrating a problem that occurs due to asynchronous clock signals.

The clock signal CLK of the electronic device 90 and the clock signal CLKH of the host device 100 are asynchronous as described above, and various problems occur due to the asynchronous clock signals. FIG. 3 is a diagram illustrating a problem that occurs due to the asynchronous clock signals CLK and CLKH. Note that, FIGS. 3, 4, and 5 described below are signal waveform diagrams schematically illustrating a signal waveform of each signal. For example, frequencies of the clock signals CLK and CLKH are different from the actual frequencies.

First, in FIG. 3, the control circuit 160 of the host device 100 generates a challenge code, and the transmitter 180 transmits a challenge signal. A pulse of the start signal STAH as indicated by A1 is generated at the timing when the transmission is completed. The receiver 70 of the electronic device 90 receives the challenge signal from the host device 100. However, a radio wave propagation time as indicated by A2 exists in propagating the challenge signal by wireless communication. That is, the receiver 70 receives the challenge signal after the radio wave propagation time has elapsed since the transmitter 180 is transmitted the challenge signal. The longer the radio wave propagation time, the longer the distance between the host device 100 and the electronic device 90.

The control circuit 60 of the electronic device 90 extracts a challenge code included in the received challenge signal. That is, the challenge code is extracted from the reception data DR transmitted in accordance with the challenge signal. Then, the control circuit 60 generates a response code by performing encryption processing on the challenge code using a common key shared by the electronic device 90 and the host device 100. Then, the transmitter 80 of the electronic device 90 transmits a response signal including the generated response code, as indicated by A3, and the receiver 170 of the host device 100 receives the response signal. As indicated by A4, the radio wave propagation time exists in propagating the response signal, and the longer the radio wave propagation time, the longer the distance between the host device 100 and the electronic device 90. As indicated by A5, a pulse of the stop signal STPH is generated at the timing when the reception of the response signal is completed.

The control circuit 160 of the host device 100 performs the decryption processing of the response code included in the received response signal. When the response code after the decryption processing matches the challenge code, the electronic device 90 is authenticated as a proper device. Then, the control circuit 160 measures a time difference TH between a time when the transmission of the challenge signal is completed and a time when the reception of the response signal is completed by the counting processing based on, for example, the clock signal CLKH. At this time, since the information on the processing time of the encryption processing is received from the electronic device 90 and a length of the response code is also known, the control circuit 160 can obtain the radio wave propagation time based on the measured time difference TH. Then, the distance between the electronic device 90 and the host device 100 is measured based on the obtained radio wave propagation time. When the measured distance is longer than the expected distance in the smart entry system, it can be determined that the relay attack is carried out.

At this time, since the clock signal CLK of the electronic device 90 and the clock signal CLKH of the host device 100 are asynchronous as illustrated in FIG. 3, a synchronization error as indicated by A6 occurs, and the synchronization error varies every time the communication is performed. Therefore, an error in measurement of the distance based on the radio wave propagation time occurs due to the synchronization error.

In the electronic device 90 such as a vehicle electronic key, a low-priced AT resonator is used, and a clock frequency of the AT resonator is, for example, about 25 MHz. Since the synchronization error indicated by A6 in FIG. 3 occurs at most one clock period, assuming that the frequencies of the clock signals CLK and CLKH are 25 MHz, a time length of the synchronization error is 40 ns. A speed of light is about 300,000 km/sec, and therefore an error of about 12 m of the distance between the electronic device 90 and the host device 100 occurs due to the synchronization error. In the smart entry system, a practical distance range for detecting the vehicle electronic key is 1 m or less. Accordingly, when the distance error of 12 m occurs due to such a synchronization error between the clock signals CLK and CLKH, the relay attack cannot be appropriately prevented.

In this case, the distance error can be reduced by increasing the frequencies of the clock signals. However, a clock signal having a frequency of 300 MHz is required to suppress the error of 1 m which is the practical distance range. When accuracy of 10 cm for further improving the accuracy of the distance range is required, a clock signal having a frequency of 3 GHz is required. When the control circuit 60 implemented by a microcomputer or the like is operated by such a high-speed clock signal CLK, a problem arises in an unnecessary increase in power consumption, an increase in cost of device, or the like. Since a vehicle electronic key with low price, small size, and low power consumption is required, it is difficult to operate the control circuit 60 using the high-speed clock signal CLK.

Further, it is assumed that the clock signal CLK for operating the control circuit 60 is generated by using a general ceramic resonator having, for example, an oscillation frequency of 8 MHz and a frequency deviation of ±0.5%. When there is an error in the oscillation frequency due to such a frequency deviation of about ±0.5%, a time of one clock when the maximum error occurs is about 622 ps. Assuming that 100 clocks are required for the encryption processing in the control circuit 60, a cumulative error time is extended to about 62.2 ns. When the cumulative error time is converted into a radio wave propagation distance, 62.2 ns is 18.66 m, which is a measurement error that cannot be ignored in measurement of a distance between a vehicle and the vehicle electronic key. Accordingly, as in JP-A-2019-65610 described above, the measurement error of the distance cannot be ignored even when in the vehicle electronic key, which is the electronic device 90, the processing time of the encryption processing is measured by the counting processing using the clock signal CLK, and the count value, which is the measurement result, is transmitted to the in-vehicle device, which is the host device 100.

In the present embodiment, the time-to-digital conversion circuit 20 is provided in the circuit device 10, and measures the time of the synchronization error which is the time difference between the asynchronous clock signals CLK and CLKH, or the processing time of the encryption processing or the like. Specifically, the time-to-digital conversion circuit 20 measures a time difference between the transition timing of the start signal STA based on the reception data DR and the transition timing of the stop signal based on the transmission data DT or the clock signal CLK, and outputs the measurement result to the control circuit 60. The time difference is accurately measured and output to the control circuit 60 by the time-to-digital conversion circuit 20 in this way, such that the problem which is illustrated in FIG. 3 and caused by the synchronization error between the clock signals CLK and CLKH can be solved. For example, the synchronization error is accurately measured, such that the accuracy of measuring the distance between the devices can be improved.

Figure 4:
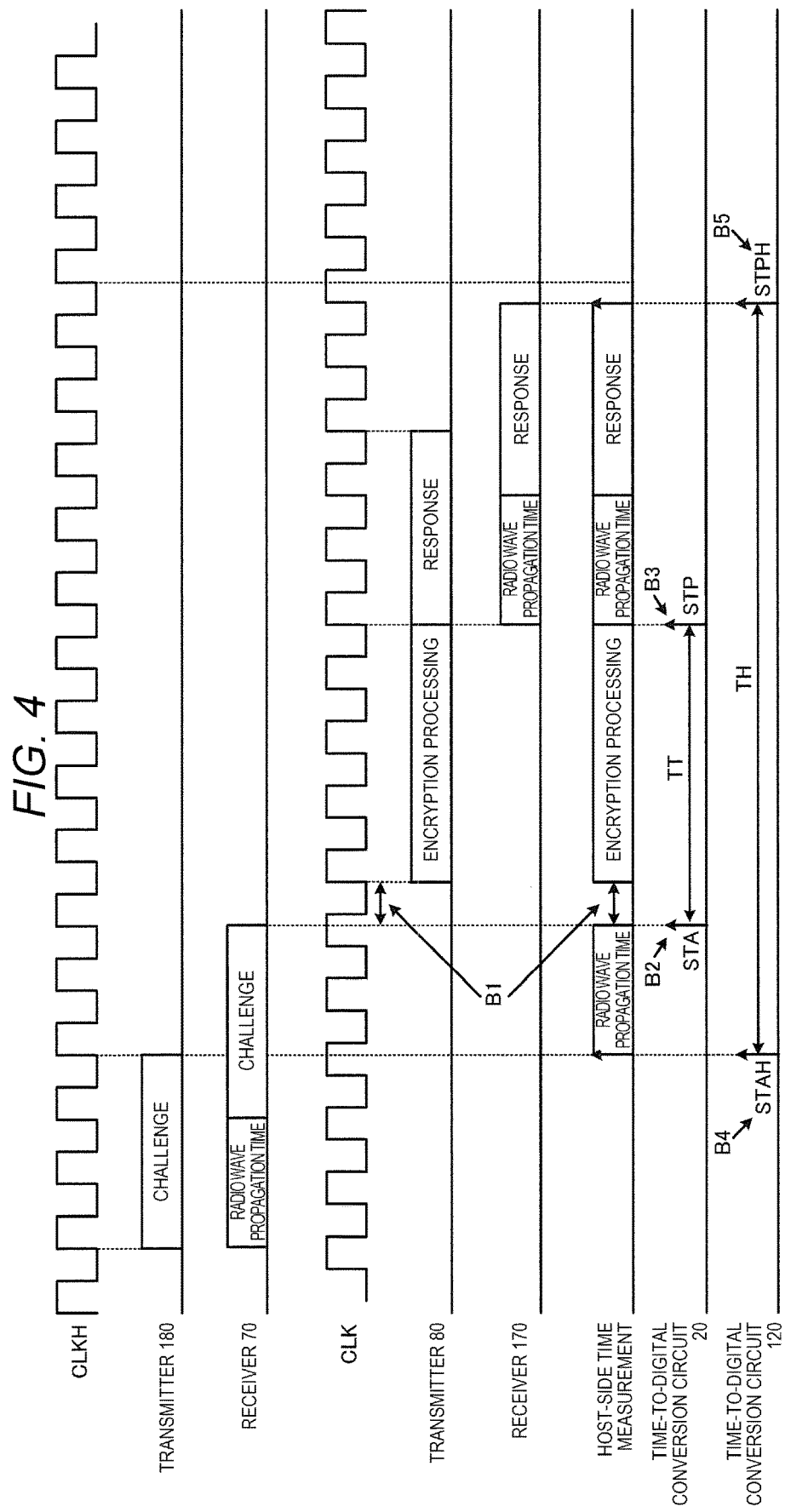
FIG. 4 is a signal waveform diagram illustrating an operation example of the present embodiment.

FIG. 4 is a signal waveform diagram illustrating an operation example of the present embodiment. In FIG. 4, the control circuit 160 of the host device 100 generates a challenge code, the transmitter 180 transmits a challenge signal including the challenge code, and the receiver 70 of the electronic device 90 receives the challenge signal. Then, the control circuit 60 of the electronic device 90 performs processing such as the encryption processing of the challenge code included in the challenge signal to generate a response code, and the transmitter 80 transmits a response signal including a response code. The receiver 170 of the host device 100 receives the response signal, and the control circuit 160 performs the decryption processing of the response code included in the response signal. After the decryption processing, determination is performed whether or not the response code and the challenge code match with each other, thereby authenticating whether or not the electronic device 90 is a normal device.

Also in FIG. 4, as indicated by B1, a synchronization error occurs in the asynchronous clock signals CLK and CLKH. At this time, in the present embodiment, the time-to-digital conversion circuit 20 measures a time difference TT between a transition timing of the start signal STA indicated by B2 and a transition timing of the stop signal STP indicated by B3. The start signal STA is a signal in which a pulse is generated and a signal level is transitioned at the timing when the reception of the challenge signal by the receiver 70 is completed. The stop signal STP is a signal in which a pulse is generated and a signal level is transitioned at the timing when the control circuit 60 completes the processing such as the encryption processing and the transmission of the response signal starts. That is, the time-to-digital conversion circuit 20 measures the time difference TT between the transition timing of the start signal STA based on the reception data DR corresponding to the challenge signal and the transition timing of the stop signal STP based on the transmission data DT corresponding to the response signal. Thereby, as illustrated in FIG. 4, the time difference TT can be measured as information on the processing time, the time difference TT obtained by adding the processing time of the encryption processing and a time of the synchronization error between the clock signals CLK and CLKH indicated by B1.

The control circuit 160 of the host device 100 measures a time difference TH between the transition timing of the start signal STAH at which a pulse is generated at the timing when the transmission of the challenge signal is completed and the transition timing of the stop signal STPH at which a pulse is generated at the timing when the reception of the response signal is completed, as indicated by B4 and B5. Further, the control circuit 160 of the host device 100 receives the measurement result of the time difference TT measured by the time-to-digital conversion circuit 20 from the electronic device 90.

Accordingly, since the length of the response code is known, the control circuit 160 can accurately measure the radio wave propagation time based on the time difference TH and the time difference TT.

That is, in FIG. 3, the measurement result of the time difference TH also varies depending on variation of the synchronization error indicated by A6, and as a result, the radio wave propagation time cannot be accurately measured and the distance between the devices cannot be accurately measured. Further, with a method of measuring the processing time of the encryption processing by the counting processing of the clock signal CLK, the radio wave propagation time or the distance between the devices may not be accurately measured due to a frequency error caused by the frequency deviation of the clock signal CLK as described above.

On the contrary, in the present embodiment, as indicated by B2 and B3 in FIG. 4, the time difference TT can be measured by the time-to-digital conversion circuit 20, the time difference TT obtained by adding the time of the synchronization error between the clock signals CLK and CLKH and the processing time of the encryption processing. Accordingly, even when the synchronization error indicated by B1 varies, the host device 100 can accurately measure the radio wave propagation time based on the time difference TH and the time difference TT. As a result, the distance between the electronic device 90 and the host device 100 can be accurately measured, and it is possible to prevent the measurement error of the distance caused by the synchronization error. Therefore, when the electronic key system is taken as an example, the relay attack can be appropriately prevented so that a position of the vehicle electronic key, which is the electronic device 90, can be accurately measured in a predetermined distance range from the in-vehicle device which is the host device 100.

As described above, in the present embodiment, the control circuit 60 outputs the start signal STA based on the reception data DR, and the time-to-digital conversion circuit 20 measures the time difference TT based on the start signal STA output from the control circuit 60. Thereby, for example, the signal level of the start signal STA is transitioned at the timing when the reception of the reception data DR is completed as indicated by B2 in FIG. 4, and thus the time-to-digital conversion circuit 20 starts the measurement of the time difference TT. As a result, for example, measurement of the processing time of the control circuit 60 that performs the processing based on the reception data DR or measurement of the synchronization error between the clock signals CLK and CLKH can be appropriately performed.

The control circuit 60 outputs the stop signal STP at the time of completing the processing of the reception data DR, and the time-to-digital conversion circuit 20 measures the time difference TT based on the stop signal STP output from the control circuit 60. That is, the time-to-digital conversion circuit 20 measures a time difference TT between a transition timing of the start signal STA indicated by B2 in FIG. 4 and a transition timing of the stop signal STP indicated by B3. Thereby, the time difference TT obtained by adding the processing time such as the encryption processing of the control circuit 60 and the time of the synchronization error can be accurately measured using the time-to-digital conversion circuit 20, such that it is possible to solve the problem caused by the synchronization error between the clock signals CLK and CLKH. For example, information on the time difference TT measured by the time-to-digital conversion circuit 20 of the electronic device 90 is transmitted to the host device 100, such that the host device 100 can accurately measure, for example, the radio wave propagation time based on information on the time difference TH measured by the host device itself and the information on the time difference TT received from the electronic device 90. Even in a situation where the synchronization error between the clock signals CLK and CLKH varies, the distance between, for example, the electronic device 90 and the host device 100 can be accurately measured based on the radio wave propagation time.

Figure 5:
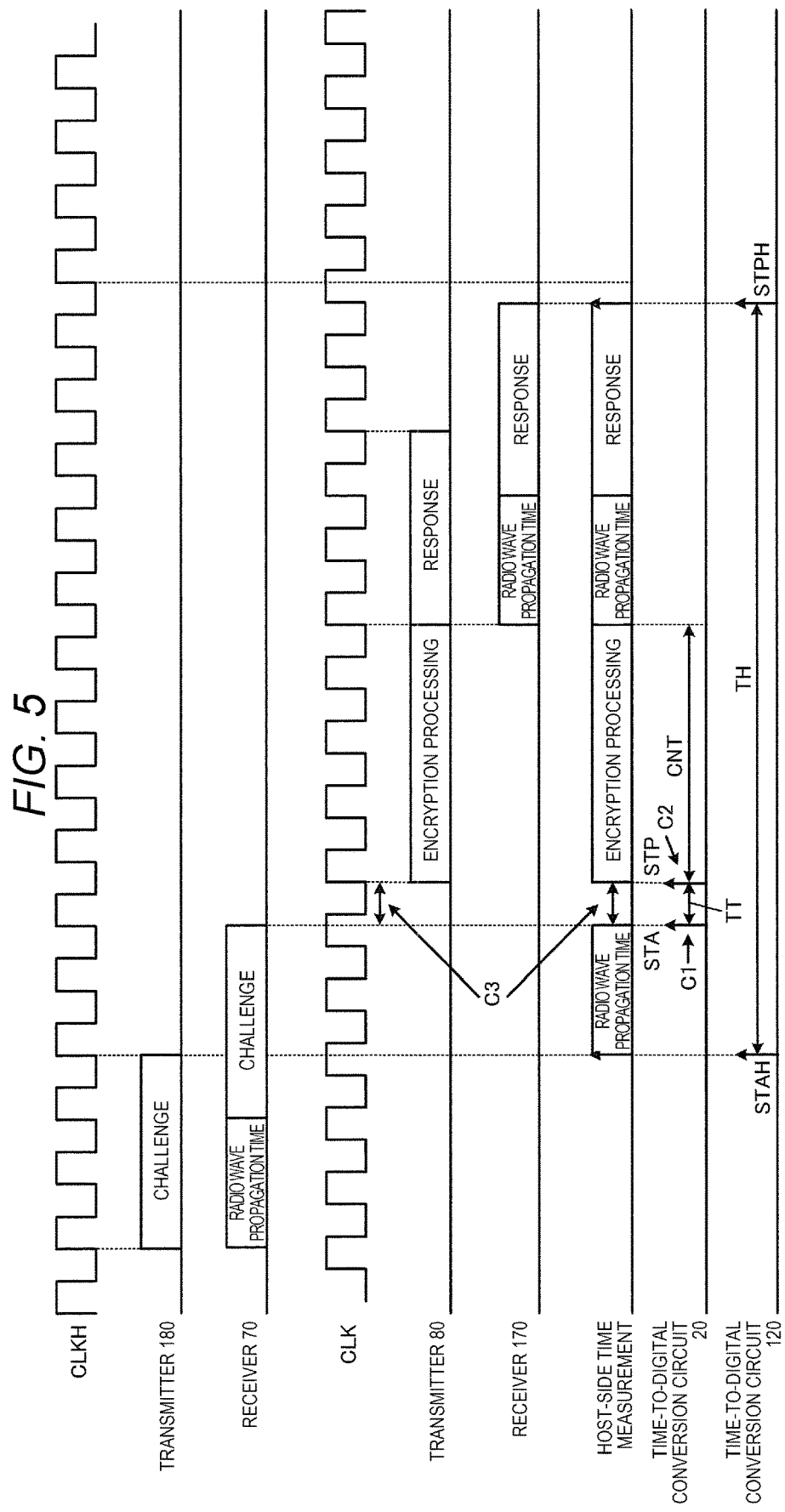
FIG. 5 is a signal waveform diagram illustrating another operation example of the present embodiment.

FIG. 5 is a signal waveform diagram illustrating another operation example of the present embodiment. Operations such as transmission of a challenge signal from the host device 100 to the electronic device 90 and transmission of the response signal from the electronic device 90 to the host device 100 are the same as those in FIG. 4, and thus descriptions thereof will not be repeated. In FIG. 5, the time-to-digital conversion circuit 20 measures a time difference TT between the transition timing of the start signal STA indicated by C1 and the transition timing of the stop signal STP indicated by C2, which changes at the transition timing of the clock signal CLK. That is, the time-to-digital conversion circuit 20 measures the time difference TT between the transition timing of the start signal STA in which a pulse is generated at the timing when the reception of the challenge signal is completed and the transition timing of the stop signal STP which is transitioned at, for example, the rising edge of the clock signal CLK. Further, the control circuit 60 performs counting processing of counting the processing time of the encryption processing with the clock signal CLK to obtain a count value CNT. Then, information on the time difference TT and the count value CNT is transmitted from the electronic device 90 to the host device 100 as information on the processing time. The time-to-digital conversion circuit 120 of the host device 100 measures a time difference TH between the transition timing of the start signal STAH which is transitioned at the timing when the transmission of the challenge signal is completed and the transition timing of the stop signal STPH which is transitioned at the timing when the reception of the response signal is completed. Then, the control circuit 160 of the host device 100 measures a radio wave delay time based on information on the measured time difference TH and the information on the time difference TT and the count value CNT received from the electronic device 90, and measures the distance between the electronic device 90 and the host device 100, for example. As in FIG. 5, the time difference TT corresponding to the time of the synchronization error between the clock signals CLK and CLKH indicated by C3 is measured using the time-to-digital conversion circuit 20. Thereby, it is possible to effectively prevent occurrence of the problem caused by the synchronization error. For example, even in a situation where the synchronization error between the clock signals CLK and CLKH varies, the distance between, for example, the electronic device 90 and the host device 100 can be accurately measured based on the radio wave propagation time.

As described above, in the present embodiment, the time-to-digital conversion circuit 20 measures a time difference TT between the transition timing of the start signal STA and the transition timing of the stop signal STP which changes at the transition timing of the clock signal CLK. The control circuit 60 performs counting processing of counting the processing time of the processing performed based on the reception data DR with the clock signal CLK.

Then, the control circuit 60 outputs, to the transmitter 80, the transmission data DT including the count value CNT obtained through the counting processing and the measurement result of the time difference TT. Then, the transmitter 80 transmits the information on the count value CNT and the time difference TT to the host device 100 as information on the processing time. With this configuration, even when the synchronization error occurs between the clock signals CLK and CLKH, it is possible to prevent occurrence of the problem caused by the synchronization error so that the time difference TT corresponding to the time of the synchronization error and the count value CNT corresponding to the processing time of the control circuit 60 are output to the transmitter 80 as the transmission data DT. For example, even in a situation where the synchronization error between the clock signals CLK and CLKH varies, the host device 100 can accurately measure the distance between the electronic device 90 and the host device 100 based on the radio wave propagation time.

In the present embodiment, the control circuit 60 performs the encryption processing based on the reception data, as processing based on the reception data. By taking the challenge response method as an example, the control circuit 60 performs the encryption processing of the challenge code included in the reception data to generate a response code. With this configuration, it is possible to output, as transmission data, data obtained by performing the encryption processing on the reception data, and implement the proper authentication processing and the like. The processing performed by the control circuit 60 based on the reception data is not limited to such encryption processing. Various processing performed by the control circuit 60 based on the reception data, such as processing of extracting specific information from the reception data, processing of analyzing information included in reception data by a specific algorithm, or processing of generating transmission data obtained by adding the specific information to the reception data, can be assumed.

In the present embodiment, the receiver 70 is a device that receives reception data by wireless communication, and the transmitter 80 is a device that transmits the transmission data by wireless communication. For example, the receiver 70 receives data transmitted at a carrier frequency of a predetermined frequency bandwidth such as LF. The transmitter 80 transmits transmission data at a carrier frequency of a predetermined frequency bandwidth such as UHF. With this configuration, the control circuit 60 can perform processing on the reception data of the receiver 70 based on the clock signal by wireless communication, to thereby transmit the transmission data based on the processing by wireless communication, and measure the time difference between the transition timing of the start signal based on the reception data and the transition timing of the stop signal based on the transmission data or the like, to thereby transmit the measured time difference to the control circuit 60.

The carrier frequency for wireless communication in the receiver 70 and the carrier frequency for wireless communication in the transmitter 80 may be different from or same as each other. The wireless communication of the receiver 70 and the transmitter 80 may be communication based on a predetermined protocol.

As illustrated in FIGS. 1 and 2, the electronic device 90 in the present embodiment includes the circuit device 10, the control circuit 60, the receiver 70, and the transmitter 80. According to the electronic device 90 with such a configuration, the control circuit 60 can perform processing on the reception data of the receiver 70 based on the clock signal, to thereby transmit, by the transmitter 80, the transmission data obtained through the processing, and the circuit device 10 can measure the time difference between the transition timing of the start signal based on the reception data and the transition timing of the stop signal based on the transmission data. The circuit device 10 to be described below may be a circuit device provided in the transmitter 80.

In this case, the control circuit 60 obtains the processing time from the reception of the reception data to the completion of the processing based on the measurement result of the time difference by the time-to-digital conversion circuit 20, and the transmitter 80 transmits the transmission data including the information on the processing time. By taking FIG. 4 as an example, the time-to-digital conversion circuit 20 measures the time difference TT between the transition timing of the start signal STA based on the reception data and transition timing of the stop signal STP based on the transmission data. Then, the transmitter 80 transmits, as transmission data, the information on the processing time including the measurement result of the time difference TT. By taking FIG. 5 as an example, the time-to-digital conversion circuit 20 measures the time difference TT between the transition timing of the start signal STA based on the reception data and transition timing of the stop signal STP based on the clock signal CLK. Then, the transmitter 80 transmits, as transmission data, the information on the processing time including the measurement result of the time difference TT and the count value CNT based on the clock signal CLK. With this configuration, even when the synchronization error occurs between the asynchronous clock signals CLK and CLKH, the information on the processing time including the time of the synchronization error can be transmitted as the transmission data, such that it is possible to prevent occurrence of the problem caused by the synchronization error.

Further, as illustrated in FIGS. 1 and 2, the communication system 200 according to the present embodiment includes the electronic device 90, and the host device 100 that transmits the reception data received by the electronic device to the electronic device 90, and receives, from the electronic device 90, the transmission data from the electronic device 90. According to the communication system 200, the electronic device 90 can perform the processing on the reception data from the host device 100 and transmits the transmission data generated based on the processing to the host device 100, to thereby measure the time difference between the transition timing of the start signal based on the reception data and the transition timing of the stop signal based on the transmission data. Therefore, even when the synchronization error occurs between the clock signal CLK of the electronic device 90 and the clock signal CLKH of the host device 100, it is possible to prevent occurrence of the problem caused by the synchronization error by using the measurement result of the time difference.

2. Circuit Device Having Transmission Circuit

Figure 6:
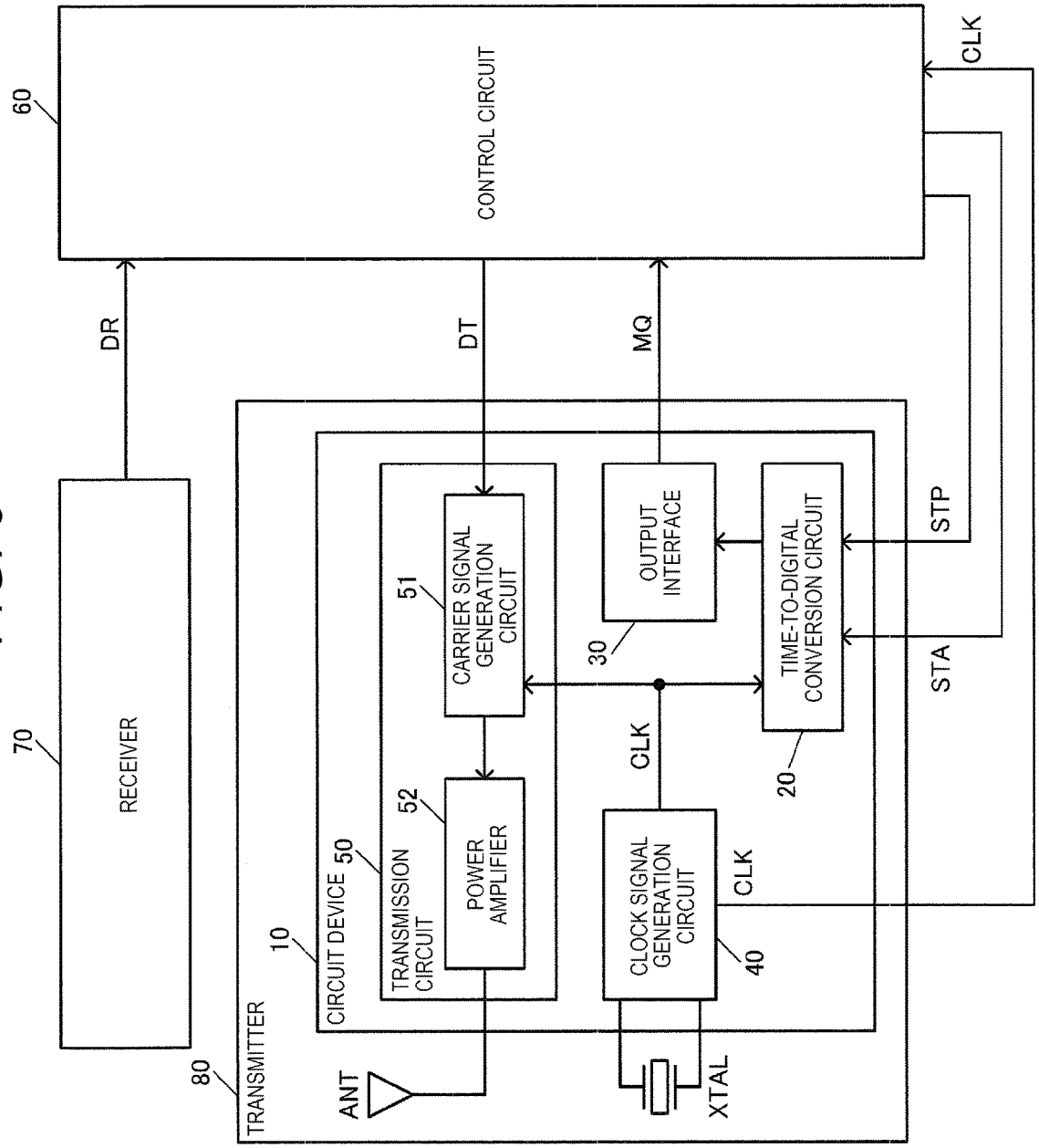
FIG. 6 illustrates a configuration example of a circuit device including a transmission circuit of a transmitter.

The circuit device 10 of the present embodiment can be provided in the transmitter 80. FIG. 6 illustrates a configuration example of the circuit device 10 including a transmission circuit 50 provided in the transmitter 80. The transmitter 80 includes the circuit device 10 of the present embodiment, an antenna ANT, and a resonator XTAL. As illustrated in FIG. 6, the circuit device 10 includes the transmission circuit 50 provided in the transmitter 80, and therefore, the clock signal CLK generated by the clock signal generation circuit 40 is used for measuring the time difference by the time-to-digital conversion circuit 20, and is also used for generating a transmission signal by the transmission circuit 50.

In FIG. 6, the circuit device 10 includes the time-to-digital conversion circuit 20, the output interface 30, the clock signal generation circuit 40, and the transmission circuit 50. That is, the time-to-digital conversion circuit 20, the output interface 30, the clock signal generation circuit 40, and the transmission circuit 50 are provided in the circuit device 10 which is a semiconductor chip. More specifically, the circuit device 10 that is a semiconductor chip, the resonator XTAL, and the antenna ANT are housed in one package, thereby constituting an oscillator that outputs the clock signal CLK. The antenna ANT may be provided in the circuit device 10.

The time-to-digital conversion circuit 20 measures a time difference between a transition timing of the start signal STA from the control circuit 60 and a transition timing of the stop signal STP. Then, the measurement result MQ of the time difference is output to the control circuit 60 via the output interface 30. The clock signal generation circuit 40 oscillates the resonator XTAL to generate the clock signal CLK. Then, the generated clock signal CLK is supplied to the time-to-digital conversion circuit 20, the transmission circuit 50, and the control circuit 60.

The transmission circuit 50 includes a carrier signal generation circuit 51 and a power amplifier 52. The carrier signal generation circuit 51 generates a carrier signal of the transmission data DT based on the clock signal CLK. That is, the carrier signal generation circuit 51 generates a carrier signal for transmitting the transmission data DT to the host device 100 by wireless communication based on the transmission data DT from the control circuit 60. The carrier signal generation circuit 51 can be implemented by, for example, a PLL circuit that multiplies the frequency of the clock signal CLK from the clock signal generation circuit 40 to generate a carrier signal having a carrier frequency.

The power amplifier 52 amplifies the carrier signal generated by the carrier signal generation circuit 51. Then, the power amplifier 52 outputs a transmission signal obtained by amplifying the carrier signal to the antenna ANT.

As a result, the transmission data DT is transmitted to the host device 100 by wireless communication.

The power amplifier 52 can include, for example, a current source implemented by a P-type transistor and a drive section implemented by an N-type transistor. In the P-type transistor constituting the current source, a bias voltage is input to a gate node, and one end of a first capacitor and one end of an external choke coil are coupled to a drain node. In the N-type transistor constituting the drive section, a rectangular wave carrier signal that is generated by the carrier signal generation circuit 51 is input to a gate node, and one end of a second capacitor and the other end of the external choke coil are coupled to the drain node. The other end of the second capacitor is coupled to the antenna ANT via a matching circuit.

As in FIG. 6, the circuit device 10 includes the transmission circuit 50 having the carrier signal generation circuit 51 and the power amplifier 52, and the carrier signal generation circuit 51 generates the carrier signal based on the clock signal CLK. With this configuration, a desired carrier signal of the carrier frequency can be generated based on the clock signal CLK generated by the clock signal generation circuit 40 to amplify the generated carrier signal by the power amplifier 52, thereby performing wireless communication of the transmission data via the antenna ANT. Further, the clock signal CLK used for measuring the time difference of the time-to-digital conversion circuit 20 can be effectively utilized to generate a carrier signal for wireless communication, and thus the circuit device 10 can commonly use the carrier signal in generation of the transmission signal and measurement of the time difference.

Figure 7:
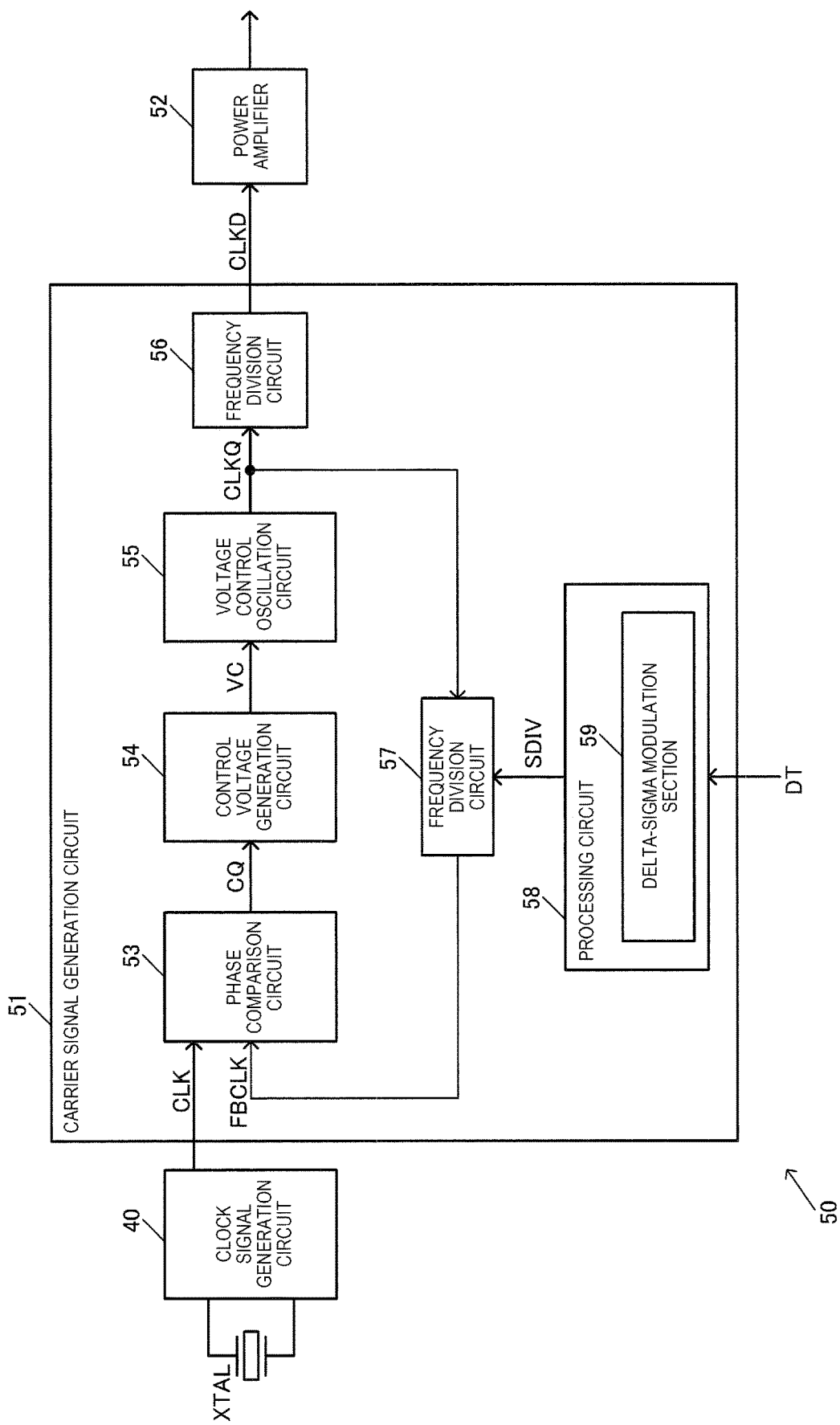
FIG. 7 illustrates a detailed configuration example of the transmission circuit and a carrier signal generation circuit.

FIG. 7 illustrates a detailed configuration example of the transmission circuit 50 and the carrier signal generation circuit 51. In FIG. 7, the carrier signal generation circuit 51 includes a phase comparison circuit 53, a control voltage generation circuit 54, a voltage control oscillation circuit 55, frequency division circuits 56 and 57, and a processing circuit 58, whereby a fractional N-type PLL circuit is implemented. The fractional N-type PLL circuit compares a phase of the clock signal CLK which is a reference clock signal with a phase of a feedback clock signal FBCLK obtained by dividing a frequency of an output clock signal CLKQ from the PLL circuit by the frequency division circuit 57. Then, the fractional N-type PLL circuit is implemented by setting a decimal frequency division ratio using a delta-sigma modulation section 59 of the processing circuit 58.

The phase comparison circuit 53 compares the phase between the clock signal CLK and the feedback clock signal FBCLK. For example, the phase comparison circuit 53 compares the phase of the clock signal CLK with the phase the feedback clock signal FBCLK, and outputs, as a signal of the phase comparison result, a signal CQ corresponding to the phase difference between the clock signal CLK and the feedback clock signal FBCLK. The signal CQ corresponding to the phase difference is, for example, a pulse signal having a pulse width proportional to the phase difference.

The control voltage generation circuit 54 generates a control voltage VC based on the result of the phase comparison in the phase comparison circuit 53. For example, the control voltage generation circuit 54 performs a charge pump operation by a charge pump circuit and filtering processing by a low pass filter based on the signal CQ of the phase comparison result from the phase comparison circuit 53, to thereby generate the control voltage VC for controlling oscillation of the voltage control oscillation circuit 55.

The voltage control oscillation circuit 55 generates the output clock signal CLKQ of a frequency corresponding to the control voltage VC. The voltage control oscillation circuit 55 can be implemented by, for example, an LC oscillation circuit, a ring type oscillator circuit, or an oscillation circuit using a resonator. For example, the voltage control oscillation circuit 55 controls the frequency of the output clock signal CLKQ by changing the capacitance of a variable capacitance element such as a varactor based on the control voltage VC. The frequency division circuit 57 divides the frequency of the output clock signal CLKQ and outputs the feedback clock signal FBCLK. For example, the frequency division circuit 57 outputs a signal having a frequency as the feedback clock signal FBCLK to the phase comparison circuit 53, the frequency obtained by dividing the frequency of the output clock signal CLKQ by a frequency division ratio SDIV set by the delta-sigma modulation section 59 of the processing circuit 58. As a result, the frequency of the output clock signal CLKQ can be set to a frequency obtained by multiplying the frequency of the clock signal CLK. Then, the frequency division circuit 56 for output outputs a clock signal CLKD having a frequency obtained by dividing the frequency of the output clock signal CLKQ by a frequency division ratio for output to the power amplifier 52. The frequency of the clock signal CLKD becomes a carrier frequency. In this case, it is necessary to modulate the carrier signal in order to perform wireless communication. Therefore, the processing circuit 58 receives the transmission data DT from the control circuit 60 and modulates the frequency division ratio SDIV of the frequency division circuit 57 based on the transmission data DT. As a result, the carrier frequency is modulated, and it is possible to perform wireless communication by so-called FSK modulation.

3. Time-to-Digital Conversion Circuit

Figure 8:
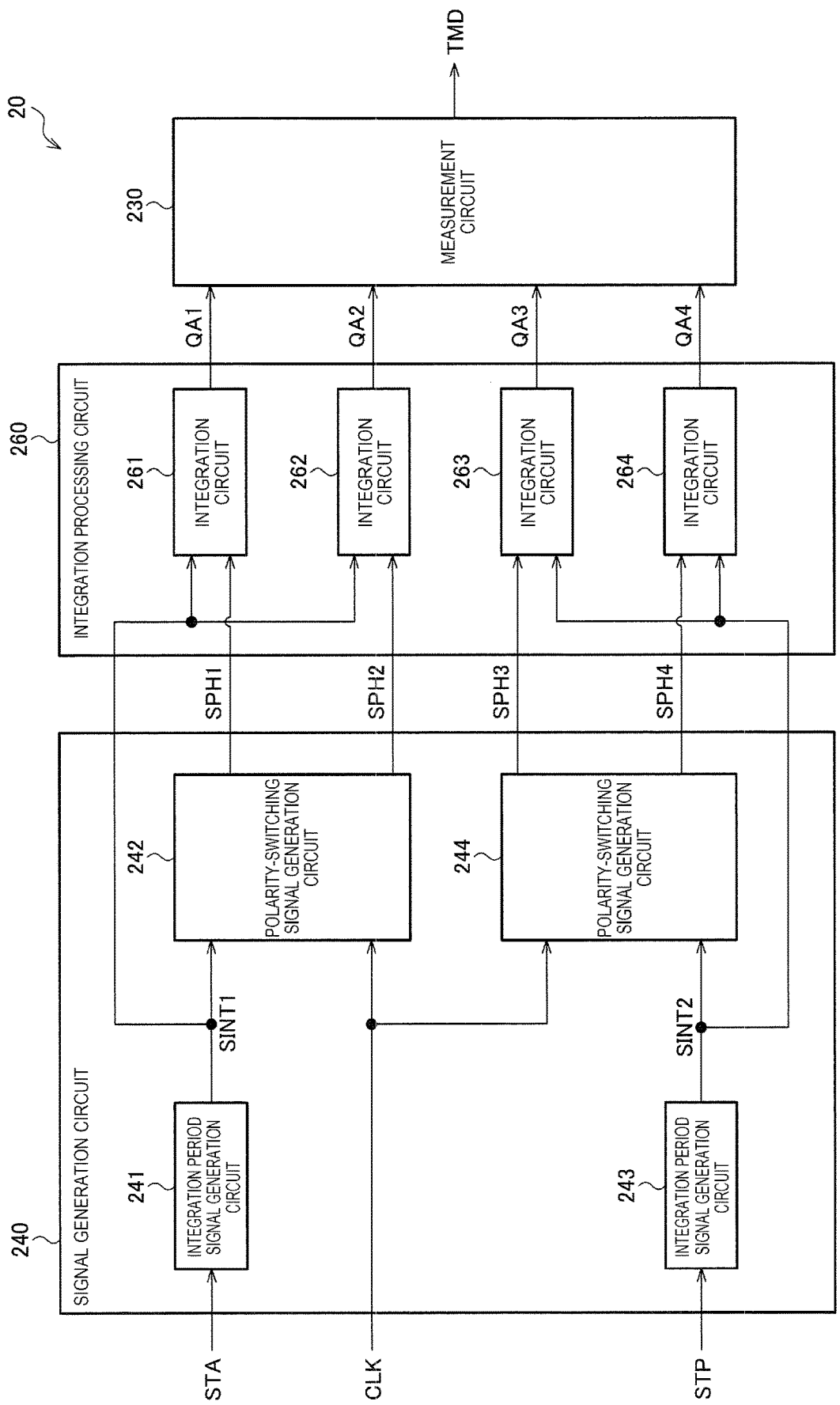
FIG. 8 illustrates a first configuration example of a time-to-digital conversion circuit.

Next, a configuration example of the time-to-digital conversion circuit 20 will be described with reference to FIGS. 8 to 11. FIG. 8 illustrates a first configuration example of the time-to-digital conversion circuit 20. The time-to-digital conversion circuit 20 includes a measurement circuit 230, a signal generation circuit 240, and an integration processing circuit 260. Here, the stop signal STP is assumed to be a signal having a frequency lower than that of the clock signal CLK. For example, the stop signal STP is a frequency-divided clock signal.

The signal generation circuit 240 generates a signal for integration processing based on the start signal STA which is the first signal, the stop signal STP which is the second signal, and the clock signal CLK.

In the first configuration example, the clock signal CLK is used as a reference clock signal that serves as a reference for time measurement. The signal generation circuit 240 includes integration period signal generation circuits 241 and 243, and polarity-switching signal generation circuits 242 and 244.

The integration period signal generation circuit 241 generates a signal SINT1 based on the start signal STA. The polarity-switching signal generation circuit 242 generates signals SPH1 and SPH2 based on the signal SINT1 and the clock signal CLK. The integration period signal generation circuit 243 generates a signal SINT2 based on the stop signal STP. The polarity-switching signal generation circuit 244 generates signals SPH3 and SPH4 based on the signal SINT2 and the clock signal CLK. The signals SINT1 and SINT2 are integration period signals, and the signals SPH1, SPH2, SPH3, and SPH4 are polarity-switching signals.

The integration processing circuit 260 performs the integration processing based on the signals SINT1, SPH1, SPH2, SINT2, SPH3, and SPH4 to output voltages QA1 to QA4 which are first to fourth integrated values. The voltages QA1 and QA2 show phases corresponding to the time difference between the transition timings of the start signal STA and the clock signal CLK. The voltages QA3 and QA4 show phases corresponding to the time difference between the transition timings of the stop signal STP and the clock signal CLK. The integration processing circuit 260 includes integration circuits 261 to 264.

The integration circuit 261 performs first integration processing based on the signals SINT1 and SPH1. The integration circuit 262 performs second integration processing based on the signals SINT1 and SPH2. The integration circuit 263 performs third integration processing based on the signals SINT2 and SPH3. The integration circuit 264 performs fourth integration processing based on the signals SINT2 and SPH4.

The measurement circuit 230 performs A/D conversion on each of the voltages QA1 to QA4 resulting from the first to fourth integration processing, and calculates time difference information TMD obtained from the A/D conversion value. The time difference information TMD indicates the time difference between the transition timings of the start signal STA and the stop signal STP.

Figure 9:
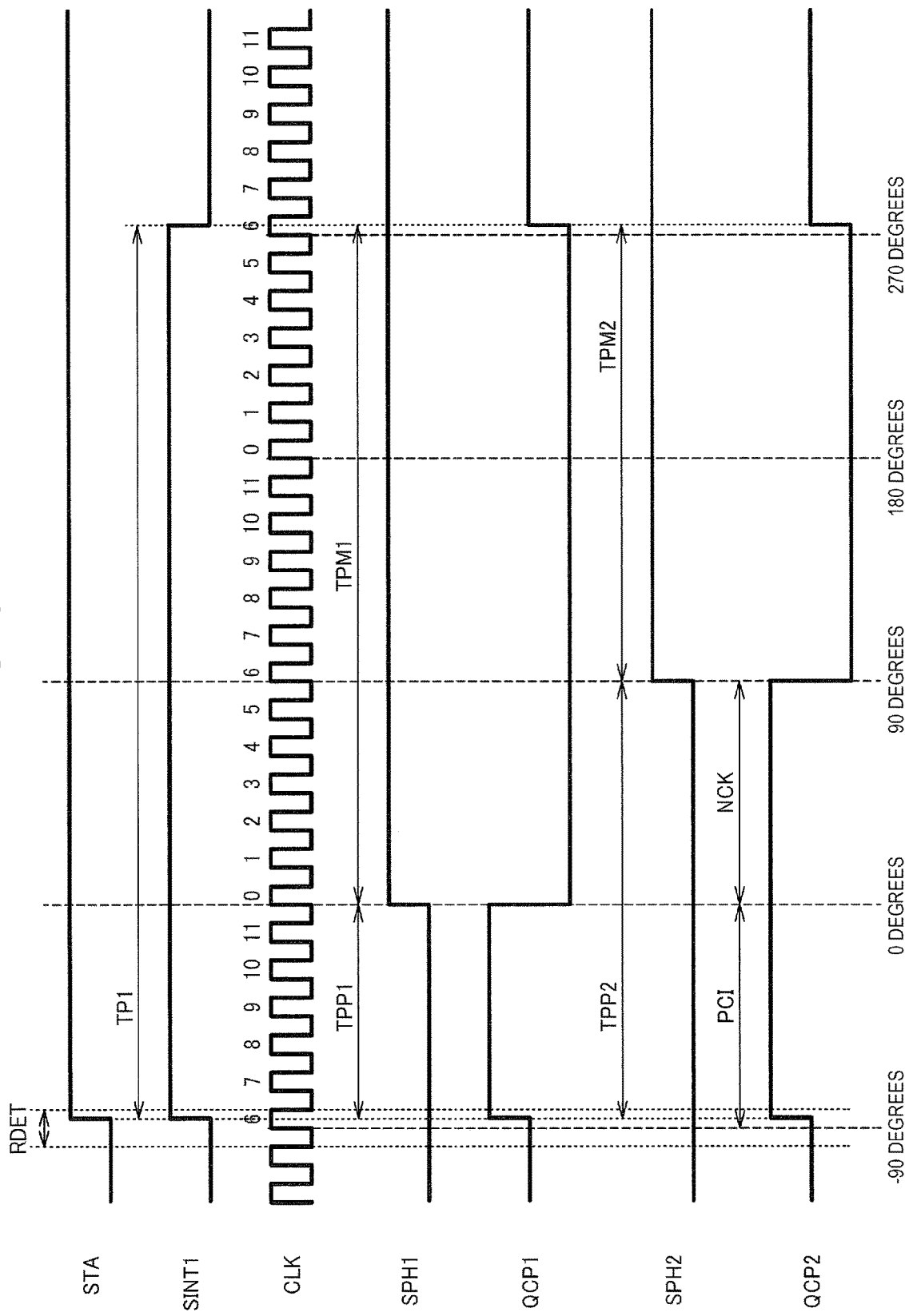
FIG. 9 is a signal waveform diagram illustrating an operation of the first configuration example of the time-to-digital conversion circuit.

FIG. 9 is a signal waveform diagram illustrating an operation of the first configuration example of the time-to-digital conversion circuit 20.

Here, the operation of obtaining the voltages QA1 and QA2 showing the phase of the start signal STA will be described as an example.

The integration period signal generation circuit 241 transitions the signal SINT1 from a low level to a high level at the transition timing of the start signal STA, maintains the signal SINT1 at a high level in an integration period TP1, and then sets the signal SINT1 to a low level. A length of the integration period TP1 may be four times a cycle of the clock signal CLK, and may not be the integral multiple of the cycle of the clock signal CLK.

A detection range RDET of the phase of the start signal STA corresponds to one cycle of the clock signal CLK. When the start signal STA is transitioned, a cycle of the clock signal CLK to which the transition timing belongs is a detection range RDET.

The polarity-switching signal generation circuit 242 transitions the signal SPH1 from a low level to a high level at the timing when the signal SPH1 is synchronized with the clock signal CLK in the integration period TP1. The transition timing of the signal SPH1 is synchronized with the rising edge after the number of clocks PCI from the rising edge of the clock signal CLK in the detection range RDET. The number of clocks PCI may be set arbitrarily. In FIG. 9, PCI=6.

It is assumed that the transition timing of the signal SPH1 is assumed as a phase reference, that is, 0 degrees. This corresponds to assuming that the phase of the start signal STA is 0 degrees when the transition timing of the start STA matches with the rising edge of the clock signal CLK. In FIG. 9, the length of the integration period TP1 corresponds to 24 cycles of the clock signal CLK. When the integration period TP1 is assumed as a phase of 360 degrees, one cycle of the clock signal CLK corresponds to a phase of 15 degrees. In FIG. 9, numbers of each pulse of the clock signal CLK is imparted using the transition timing of the signal SPH1 as a reference "0". When the numbers differ by 1, the phases differ by 15 degrees.

The polarity-switching signal generation circuit 242 transitions the signal SPH2 from a low level to a high level in the integration period TP1 after the number of clocks NCK of the clock signal CLK from the transition timing of the signal SPH1. In FIG. 9, NCK=6, and the phases of the signals SPH1 and SPH2 differ by 90 degrees.

This corresponds to obtaining two integrated values with the phase shifted by 90 degrees.

The integration period TP1 is divided into a period TPP1 and a period TPM1 according to the transition timing of the signal SPH1. The integration circuit 261 performs the first integration processing with first polarity in the period TPP1, and performs the first integration processing with second polarity that is reversed to the first polarity in the period TPM1. In FIG. 9, the first polarity is positive and the second polarity is negative. The integration circuit 261 outputs the voltage QA1 as an integration result.

The integration period TP1 is divided into a period TPP2 and a period TPM2 according to the transition timing of the signal SPH2. The integration circuit 262 performs the second integration processing with the first polarity in the period TPP2 and the second integration processing with the second polarity in the period TPM2. The integration circuit 262 outputs the voltage QA2 as an integration result.

Although the operation of obtaining the voltages QA1 and QA2 showing the phase of the start signal STA has been described above, the voltages QA3 and QA4 showing the phase of the stop signal STP can also be obtained by the same operation.

A time difference between the transition timings of the start signal STA and the stop signal STP is defined as TDF. The measurement circuit 230 obtains the time difference TDF by an equation of TDF=TC×(QA3/AZ2−QA1/AZ1). A cycle of the clock signal CLK is defined as TC. AZ1=QA2−QA1, and AZ2=QA4−QA3. AZ1 and AZ2 are constant regardless of the value of the time difference TDF. In FIG. 9, the integration period TP1 is an unknown number, and offsets due to the unknown number occur in QA1/AZ1 and QA3/AZ2. However, the integration period TP1 for obtaining QA1 and QA3 is common, and therefore, the offset of QA1/AZ1 and the offset of QA3/AZ2 have the same value and are canceled by subtraction.

Figure 10:
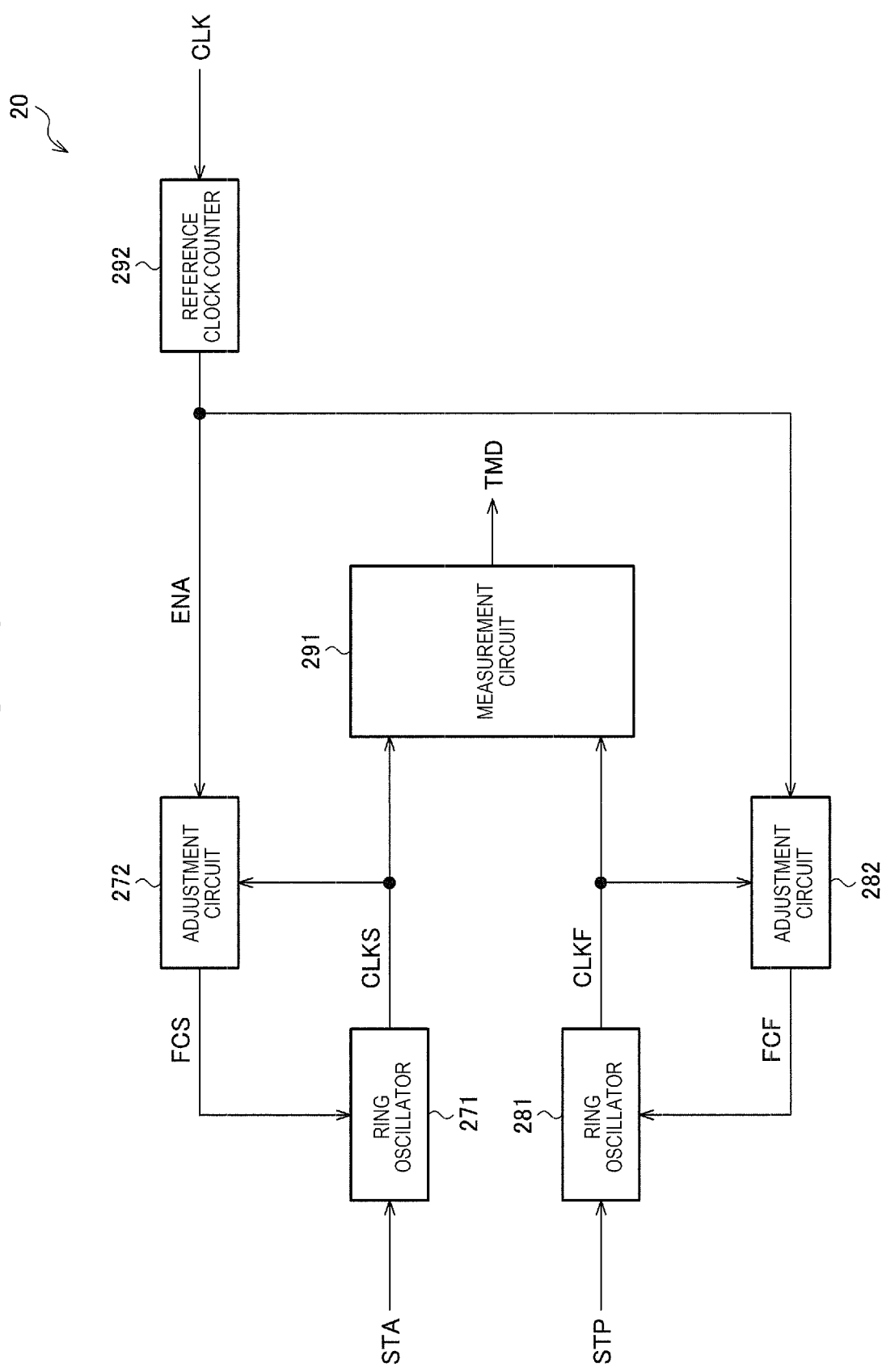
FIG. 10 illustrates a second configuration example of the time-to-digital conversion circuit.

FIG. 10 illustrates a second configuration example of the time-to-digital conversion circuit 20. The time-to-digital conversion circuit 20 includes ring oscillators 271 and 281, a measurement circuit 291, a reference clock counter 292, and adjustment circuits 272 and 282.

In the second configuration example, the time-to-digital conversion circuit 20 has a measurement mode and an adjustment mode. The measurement mode is a mode for measuring a time difference, and the adjustment mode is a mode for adjusting oscillation frequencies of the ring oscillators 271 and 281.

First, the measurement mode will be described. In the ring oscillator 271, an oscillation loop is enabled at the transition timing of the start signal STA. As a result, the ring oscillator 271 starts oscillation and generates a clock signal CLKS. In the ring oscillator 281, the oscillation loop is enabled at the transition timing of the stop signal STP. As a result, the ring oscillator 281 starts oscillation and generates a clock signal CLKF. A frequency of the clock signal CLKS is defined as f1 and a frequency of the clock signal CLKF is defined as f2. f2 is higher than f1.

The measurement circuit 291 obtains the time difference information TMD based on the clock signal CLKS and the clock signal CLKF. The time difference information TMD indicates the time difference between the transition timings of the start signal STA and the stop signal STP. A method of obtaining the time difference information TMD will be described below with reference to FIG. 11.

Next, the adjustment mode will be described. In the second configuration example, the clock signal CLK is used as a reference clock signal that serves as a reference for the oscillation frequencies of the ring oscillators 271 and 281. The reference clock counter 292 counts the number of clocks of the clock signal CLK, and outputs an enable signal ENA which is active during a period of counting a given number of clocks.

The adjustment circuit 272 counts the number of clocks of the clock signal CLKS during a period when the enable signal ENA is active. The adjustment circuit 272 integrates a difference between a count value of the clock signal CLK and a first target value, and outputs control data FCS obtained by the integration. The first target value is a value for setting the oscillation frequency of the ring oscillator 271. The ring oscillator 271 oscillates at the oscillation frequency according to the control data FCS. For example, a variable capacitance circuit is provided as a load of the oscillation loop of the ring oscillator 271, and the capacitance value of the variable capacitance circuit is controlled by the control data FCS. Thereby, the oscillation frequency of the ring oscillator 271 is adjusted.

The adjustment circuit 282 counts the number of clocks of the clock signal CLKF during the period when the enable signal ENA is active. The adjustment circuit 272 integrates a difference between a count value of the clock signal CLKF and a second target value, and outputs control data FCF obtained by the integration. The second target value is a value for setting the oscillation frequency of the ring oscillator 281. The ring oscillator 281 oscillates at the oscillation frequency according to the control data FCF. For example, a variable capacitance circuit is provided as a load of the oscillation loop of the ring oscillator 281, and a capacitance value of the variable capacitance circuit is controlled by the control data FCF. Thereby, the oscillation frequency of the ring oscillator 281 is adjusted.

When the time-to-digital conversion circuit 20 is set to the measurement mode after the adjustment mode, the control data FCS and FCF obtained in the adjustment mode are input to the ring oscillators 271 and 281. Thus, the ring oscillators 271 and 281 oscillate at the oscillation frequency adjusted in the adjustment mode, and the measurement circuit 291 can measure a time using the clock signals CLKS and CLKF having accurate frequencies.

Figure 11:
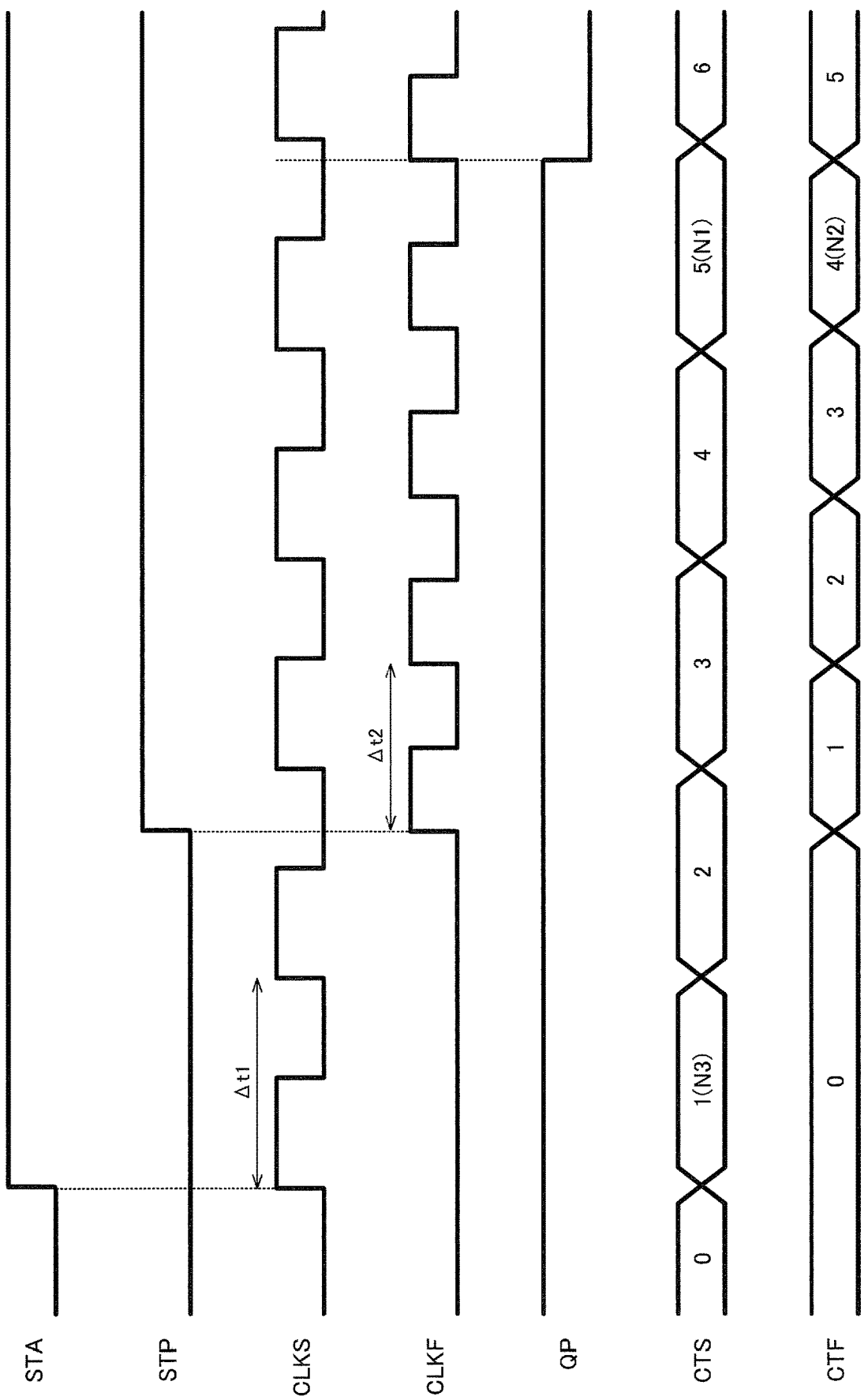
FIG. 11 is a signal waveform diagram illustrating an operation of the second configuration example of the time-to-digital conversion circuit.

FIG. 11 is a signal waveform diagram illustrating an operation of the second configuration example of the time-to-digital conversion circuit 20. FIG. 11 illustrates a signal waveform diagram in the measurement mode.

The measurement circuit 291 compares phases of the clock signal CLKS and the clock signal CLKF. When it is determined that the phase of the clock signal CLKS and the phase of the clock signal CLKF are replaced with each other, the measurement circuit 291 sets a phase comparison result signal QP from the high level to the low level. The phase comparison result signal QP is an internal signal of the measurement circuit 291.

The measurement circuit 291 counts the number of clocks of the clock signal CLKS. This count value is defined as CTS. Further, the measurement circuit 291 counts the number of clocks of the clock signal CLKF. This count value is defined as CTF.

The measurement circuit 291 acquires the count values CTS and CTF at a falling edge of the phase comparison result signal QP. The count values are defined as N1 and N2. When a cycle of the clock signal CLKS is $\Delta t1=1/f1$, and a cycle of the clock signal CLKF is $\Delta t2=1/f2$, a difference therebetween is resolution of $\Delta t=|\Delta t1-\Delta t2|$. When $N3=N1-N2$, the measurement circuit 291 obtains the time difference between the transition timings of the start signal STA and the stop signal STP by $N3\times\Delta t1+N2\times\Delta t$. In FIG. 11, since N1=5, N2=4, and N3=1, the time difference is $\Delta t1+4\times\Delta t$.

As described above, in order to perform time-to-digital conversion for obtaining the time difference using the clock signal CLK, for example, the time-to-digital conversion circuit 20 of the present embodiment can obtain the time difference with accuracy corresponding to frequency accuracy of the clock signal CLK, thereby obtaining the measurement result of the time difference with high accuracy. In particular, the clock signal CLK is generated using the resonator XTAL, such that it is possible to perform time-to-digital conversion using the clock signal CLK with high frequency accuracy, thereby obtaining the measurement result of the time difference with higher frequency accuracy.

4. Electronic Device

Figure 12:
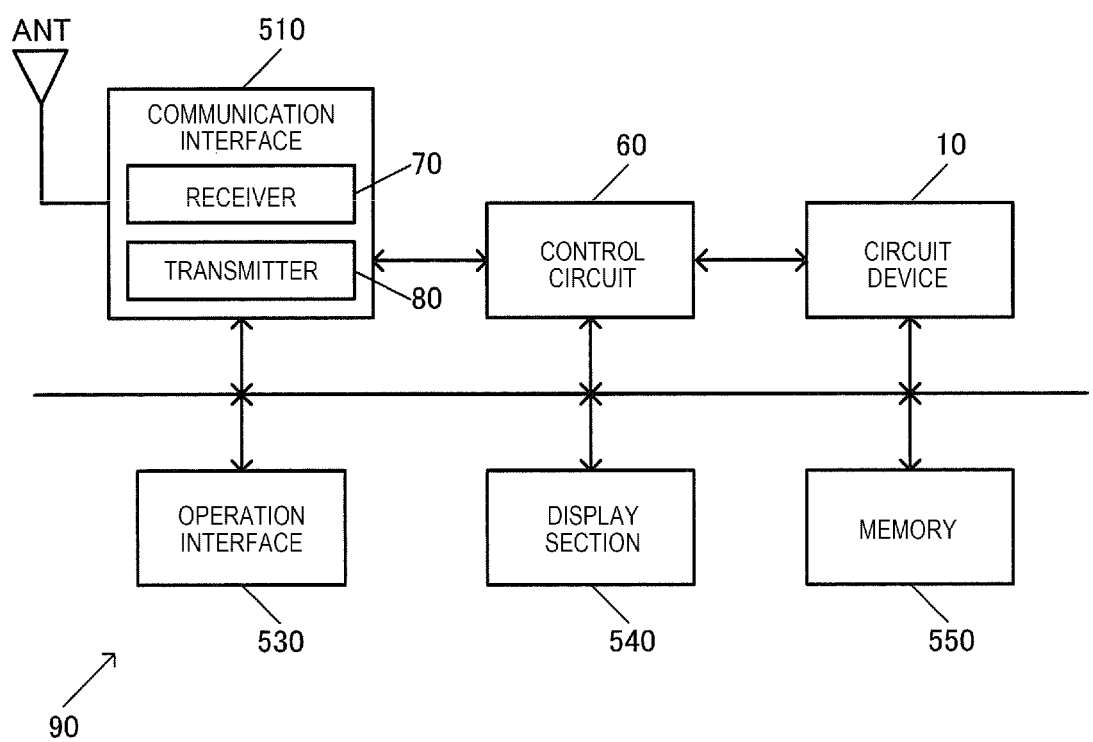
FIG. 12 illustrates a configuration example of an electronic device.

FIG. 12 illustrates a configuration example of the electronic device 90 of the present embodiment. The electronic device 90 includes the circuit device 10 of the present embodiment, the control circuit 60 that is a processing device, and a communication interface 510 including the receiver 70 and the transmitter 80. The electronic device 90 can also include an operation interface 530, a display section 540, a memory 550, and the antenna ANT.

The electronic device 90 is, for example, a vehicle electronic key, a measurement device that measures a physical quantity such as a distance, a time, a flow velocity, or a flow rate, a biological information measuring device that measures biological information, an in-vehicle device, or a network-related device such as a base station or a router. The biological information measuring device is, for example, an ultrasonic measurement device, a sphygmograph, a blood pressure measurement device, or the like. The in-vehicle device is, for example, a device mounted in a vehicle. Further, the electronic device 90 may be a wearable device such as a head-mounted display device or a timepiece-related device, a robot, a printing device, a projection device, a mobile information terminal such as a smartphone, a content provision device that distributes contents, or a video device such as a digital camera or a video camera.

The communication interface 510 performs processing of receiving data from the outside via the antenna ANT and transmitting data to the outside. The control circuit 60 performs control processing of the electronic device 90, various digital processing of data transmitted and received via the communication interface 510, or the like. A function of the control circuit 60 can be implemented by, for example, a processor such as a microcomputer. The operation interface 530 is for a user to perform an input operation, and can be implemented by an operation button, a touch panel display, or the like. The display section 540 displays various pieces of information, and can be implemented by a display such as a liquid crystal or an organic EL. The memory 550 stores data, and a function thereof can be implemented by a semiconductor memory such as RAM or ROM.

As described above, the circuit device of the present embodiment relates to a circuit device used in an electronic device including a receiver, a control circuit that performs processing on reception data received by the receiver using a clock signal, a transmitter that transmits transmission data generated by performing the processing based on the reception data by the control circuit. The circuit device includes a time-to-digital conversion circuit that measures a time difference between a transition timing of a start signal based on the reception data and a transition timing of a stop signal based on the transmission data or the clock signal, and an output interface that outputs, to the control circuit, a measurement result of the time difference of the time-to-digital conversion circuit.

According to the present embodiment, in the circuit device used in the electronic device including the receiver, the control circuit that performs processing on the reception data of the receiver using the clock signal, and the transmitter that transmits the transmission data, the time-to-digital conversion circuit measures the time difference between the transition timing of the start signal based on the reception data and the transition timing of the stop signal based on the transmission data or the clock signal. The measurement result of the time-to-digital conversion circuit is output to the control circuit via the output interface. With this configuration, even when the clock signals of the devices are asynchronous in the communication system performing communication between the devices, it is possible to obtain the accurate measurement result of the processing time of the control circuit or the information on the synchronization error between the clock signals by using the time-to-digital conversion circuit. Therefore, it is possible to provide a circuit device or the like that can solve a problem that occurs due to the asynchronous clock signals.

In the present embodiment, the circuit device may further include a clock signal generation circuit that generates a clock signal using a resonator and outputs the clock signal to a control circuit.

The control circuit is operated by using the clock signal generated by the clock signal generation circuit as described above, and thus, a separate clock signal generation circuit does not need to be provided in the control circuit, thereby reducing a size or cost of the electronic device.

In the present embodiment, the time-to-digital conversion circuit may measure the time difference using the clock signal generated by the clock signal generation circuit.

By performing time-to-digital conversion using the clock signal generated by a resonator, it is possible to measure the time difference between the transition timing of the start signal based on the reception data and the transition timing of the stop signal based on the transmission data or the clock signal with high accuracy, and output the measurement result to the control circuit with high accuracy.

In the present embodiment, the control circuit may output the start signal based on the reception data, and the time-to-digital conversion circuit may measure the time difference based on the start signal output from the control circuit.

With this configuration, a signal level of the start signal can be transitioned based on the reception data, and the time-to-digital conversion circuit can start measurement of the time difference, and thus it is possible to solve the problem caused by the synchronization error between the clock signals.

In the present embodiment, the control circuit may output the stop signal at the time of completing the processing of the reception data, and the time-to-digital conversion circuit may measure the time difference based on the stop signal output from the control circuit.

With this configuration, the time difference obtained by adding the processing time of the control circuit and the time of the synchronization error can be accurately measured using the time-to-digital conversion circuit, such that it is possible to solve the problem caused by the synchronization error between the clock signals.

In the present embodiment, the time-to-digital conversion circuit may measure a time difference between the transition timing of the start signal and the transition timing of the stop signal which changes at the transition timing of the clock signal. The control circuit may perform, by the clock signal, counting processing of counting processing time of the processing performed based on the reception data, and output, to the transmitter, the transmission data including a count value obtained through the counting processing and the measurement result of the time difference.

With this configuration, even when the synchronization error occurs in the clock signals, it is possible to output, to the transmitter as the transmission data, the time difference corresponding to the time of the synchronization error and the count value corresponding to the processing time of the control circuit, thereby preventing occurrence of the problem caused by the synchronization error.

In the present embodiment, the circuit device may include a transmission circuit provided in the transmitter.

With this configuration, the transmission circuit of the transmitter can be implemented by effectively utilizing the circuit device having the time-to-digital conversion circuit for measuring the time difference.

In the present embodiment, the transmission circuit may include a carrier signal generation circuit for generating a carrier signal of the transmission data based on the clock signal and a power amplifier for amplifying the carrier signal.

With this configuration, the carrier signal having a desired carrier frequency can be generated based on the clock signal to amplify the generated carrier signal by the power amplifier, thereby performing wireless communication of the transmission data.

In the present embodiment, the processing performed by the control circuit may be encryption processing based on the reception data.

With this configuration, it is possible to output, as transmission data, data obtained by performing the encryption processing on the reception data, and implement proper authentication processing and the like.

In the present embodiment, the receiver may be a device that receives the reception data by wireless communication, and the transmitter may be a device that transmits the transmission data by wireless communication.

With this configuration, the control circuit can perform the processing on the reception data of the receiver by wireless communication based on the clock signal, to thereby transmit the transmission data based on the processing by wireless communication, and measure the time difference between the transition timing of the start signal based on the reception data and the transition timing of the stop signal based on the transmission data, to thereby transmit the measured time difference to the control circuit.

The electronic device of the present embodiment relates to an electronic device including the circuit device, the control circuit, the receiver, and the transmitter, which are described above.

According to the electronic device with such a configuration, the control circuit can perform the processing on the reception data of the receiver based on the clock signal, to thereby transmit, by the transmitter, the transmission data obtained through the processing, and the circuit device can measure the time difference between the transition timing of the start signal based on the reception data and the transition timing of the stop signal based on the transmission data.

In the present embodiment, since the control circuit obtains information on a processing time to complete the processing after receiving the reception data based on the measurement result of the time difference, the transmitter may transmit the transmission data including the information on the processing time.

With this configuration, even when the synchronization error occurs in the clock signals, the information on the processing time including the time of the synchronization error can be transmitted as transmission data, thereby preventing occurrence of the problem caused by the synchronization error.

The present embodiment relates to a communication system including the electronic device described above, and a host device that transmits reception data received by the electronic device to the electronic device, and receives, from the electronic device, the transmission data from the electronic device.

According to the communication system with such a configuration, the electronic device can perform processing on the reception data from the host device, transmit, to the host device, the transmission data generated based on the processing, and measure the time difference between the transition timing of the start signal based on the reception data and the transition timing of the stop signal based on the transmission data.

The circuit device of the present embodiment relates to a circuit device used in a vehicle electronic key including a receiver, a control circuit that performs processing based on reception data received by the receiver using a clock signal, and a transmitter that transmits transmission data generated by performing processing on the reception data by the control circuit. The circuit device includes a time-to-digital conversion circuit that measures a time difference between a transition timing of a start signal based on the reception data and a transition timing of a stop signal based on the transmission data or the clock signal, and an output interface that outputs, to the control circuit, a measurement result of the time difference of the time-to-digital conversion circuit.

According to the present embodiment, in the circuit device used in the vehicle electronic key including the receiver, the control circuit that performs processing on the reception data of the receiver using the clock signal, and the transmitter that transmits the transmission data, the time-to-digital conversion circuit measures the time difference between the transition timing of the start signal based on the reception data and the transition timing of the stop signal based on the transmission data or the clock signal. The measurement result of the time-to-digital conversion circuit is output to the control circuit via the output interface. With this configuration, even when the clock signals of the vehicle electronic key and the in-vehicle device are asynchronous in a vehicle electronic key system, it is possible to obtain the accurate measurement result of the processing time of the control circuit or the information on the synchronization error between the clock signals by using the time-to-digital conversion circuit. Therefore, it is possible to provide a circuit device or the like that can solve a problem that occurs due to the asynchronous clock signals.

The vehicle electronic key system of the present embodiment includes the vehicle electronic key including the circuit device described above, and an in-vehicle device that transmits reception data to the vehicle electronic key and receives transmission data from the vehicle electronic key, in which the control circuit generates transmission data based on a measurement result from the output interface, and the in-vehicle device detects that wireless communication between the vehicle electronic key and the in-vehicle device is not directly performed based on the transmission data.

According to the vehicle electronic key system with such a configuration, the vehicle electronic key can perform processing on the reception data from the in-vehicle device, transmit the transmission data generated based on the processing to the host device, and measure the time difference between the transition timing of the start signal based on the reception data and the transition timing of the stop signal based on the transmission data or the like. It is determined whether or not a relay attack is received based on the measurement result, such that it is possible to improve determination accuracy.

Although the present embodiment has been described in detail above, those skilled in the art will easily understand that many modifications can be made without substantially departing from novel items and effects of the present disclosure. All such modified examples are thus included in the scope of the present disclosure. For example, terms in the descriptions or drawings given even once along with different terms having identical or broader meanings can be replaced with those different terms in all parts of the descriptions or drawings. Further, all combinations of the present embodiment and modified examples are also included within the scope of the present disclosure. Furthermore, the configurations, operations, and the like of the circuit device, the time-to-digital conversion circuit, the control circuit, the receiver, the transmitter, the electronic device, the communication system, and the like are not limited to those described in the present embodiment, and various modifications thereof are possible.

What is claimed is:

1. A circuit device used in an electronic device including a receiver, a control circuit that performs processing on reception data received by the receiver using a clock signal, a transmitter that transmits transmission data generated by performing processing based on the reception data by the control circuit, the circuit device comprising:
    a time-to-digital conversion circuit that measures a time difference between a transition timing of a start signal based on the reception data and a transition timing of a stop signal based on the transmission data or the clock signal; and
    an output interface that outputs, to the control circuit, a measurement result of the time difference of the time-to-digital conversion circuit,
    wherein the time-to-digital conversion circuit measures the time difference between the transition timing of the start signal and the transition timing of the stop signal which chances at a transition timing of the clock signal.

2. The circuit device according to claim 1, further comprising:
    a clock signal generation circuit that generates the clock signal using a resonator and outputs the clock signal to the control circuit.

3. The circuit device according to claim 2, wherein
    the time-to-digital conversion circuit measures the time difference using the clock signal generated by the clock signal generation circuit.

4. The circuit device according to claim 1, wherein
the control circuit outputs the start signal based on the reception data, and
the time-to-digital conversion circuit measures the time difference based on the start signal output from the control circuit.

5. The circuit device according to claim 4, wherein
the control circuit outputs the stop signal when the processing of the reception data is completed, and
the time-to-digital conversion circuit measures the time difference based on the stop signal output from the control circuit.

6. The circuit device according to claim 1, wherein
the control circuit performs counting processing of counting, by the clock signal, a processing time of the processing performed based on the reception data, and outputs, to the transmitter, the transmission data including a count value obtained through the counting processing and the measurement result of the time difference.

7. The circuit device according to claim 1, further comprising:
a transmission circuit provided in the transmitter.

8. The circuit device according to claim 7, wherein
the transmission circuit includes
a carrier signal generation circuit that generates a carrier signal of the transmission data based on the clock signal, and
a power amplifier that amplifies the carrier signal.

9. The circuit device according to claim 1, wherein
the processing performed by the control circuit is encryption processing based on the reception data.

10. The circuit device according to claim 1, wherein
the receiver is a device that receives the reception data by wireless communication, and
the transmitter is a device that transmits the transmission data by wireless communication.

11. An electronic device comprising:
the circuit device according to claim 1;
the control circuit;
the receiver; and
the transmitter.

12. The electronic device according to claim 11, wherein
the control circuit obtains information on a processing time to complete the processing after receiving the reception data based on the measurement result of the time difference, and
the transmitter transmits the transmission data including the information on the processing time.

13. A communication system comprising:
the electronic device according to claim 11; and
a host device that transmits the reception data received by the electronic device to the electronic device, and receives, from the electronic device, the transmission data from the electronic device.

14. A circuit device used in a vehicle electronic key including a receiver, a control circuit that performs processing on reception data received by the receiver using a clock signal, a transmitter that transmits transmission data generated by performing processing based on the reception data by the control circuit, the circuit device comprising:
a time-to-digital conversion circuit that measures a time difference between a transition timing of a start signal based on the reception data and a transition timing of a stop signal based on the transmission data or the clock signal; and
an output interface that outputs, to the control circuit, a measurement result of the time difference of the time-to-digital conversion circuit,
wherein the time-to-digital conversion circuit measures the time difference between the transition timing of the start signal and the transition timing of the stop signal which changes at a transition timing of the clock signal.

15. A vehicle electronic key system comprising:
a vehicle electronic key including the circuit device according to claim 14; and
an in-vehicle device that transmits the reception data to the vehicle electronic key and receives the transmission data from the vehicle electronic key, wherein
the control circuit generates the transmission data based on the measurement result from the output interface, and
the in-vehicle device detects that wireless communication between the vehicle electronic key and the in-vehicle device is not directly performed based on the transmission data.

* * * * *